United States Patent
Leon

(10) Patent No.: US 7,954,693 B2
(45) Date of Patent: Jun. 7, 2011

(54) METHOD OF TREATING AND PROBING A VIA

(75) Inventor: Alexander Leon, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/263,469

(22) Filed: Nov. 1, 2008

(65) Prior Publication Data

US 2009/0051379 A1    Feb. 26, 2009

Related U.S. Application Data

(62) Division of application No. 11/112,016, filed on Apr. 22, 2005, now Pat. No. 7,461,771.

(51) Int. Cl.
*B23K 30/02* (2006.01)

(52) U.S. Cl. .............. 228/180.22; 228/104; 228/103

(58) Field of Classification Search .......... 228/103, 228/104, 180.22, 56.3; 324/754, 761; 361/767, 361/768, 769, 770, 771
See application file for complete search history.

(56) References Cited

U.S. PATENT DOCUMENTS

| | | | | |
|---|---|---|---|---|
| 5,032,787 A * | 7/1991 | Johnston et al. | .............. | 324/761 |
| 5,597,737 A * | 1/1997 | Greer et al. | ............... | 438/17 |
| 7,025,628 B2 * | 4/2006 | LaMeres et al. | ............. | 439/502 |
| 7,040,526 B2 * | 5/2006 | Negishi et al. | ............. | 228/103 |
| 7,315,176 B2 * | 1/2008 | Nelson et al. | ............. | 324/761 |
| 2007/0018663 A1 * | 1/2007 | Leinbach et al. | ............. | 324/754 |

* cited by examiner

*Primary Examiner* — Roy King
*Assistant Examiner* — Michael Aboagye

(57) ABSTRACT

A method of treating a via connected with a substrate and a method of probing the via are disclosed. A pattern of a lead-free solder paste is applied around a hole of the via without completely covering a pad of the via. The paste is reflowed to form a pattern of a lead-free solder on a pad that covers only a portion of a surface area of the pad and is positioned around the hole. The solder may be substantially symmetrically positioned around the hole. A flux generated during reflow is insufficient to plug the hole. The lead-free solder can be probed by a blade probe including collinear first and second edges and having a preferred orientation relative to the pattern of the lead-free solder.

20 Claims, 19 Drawing Sheets

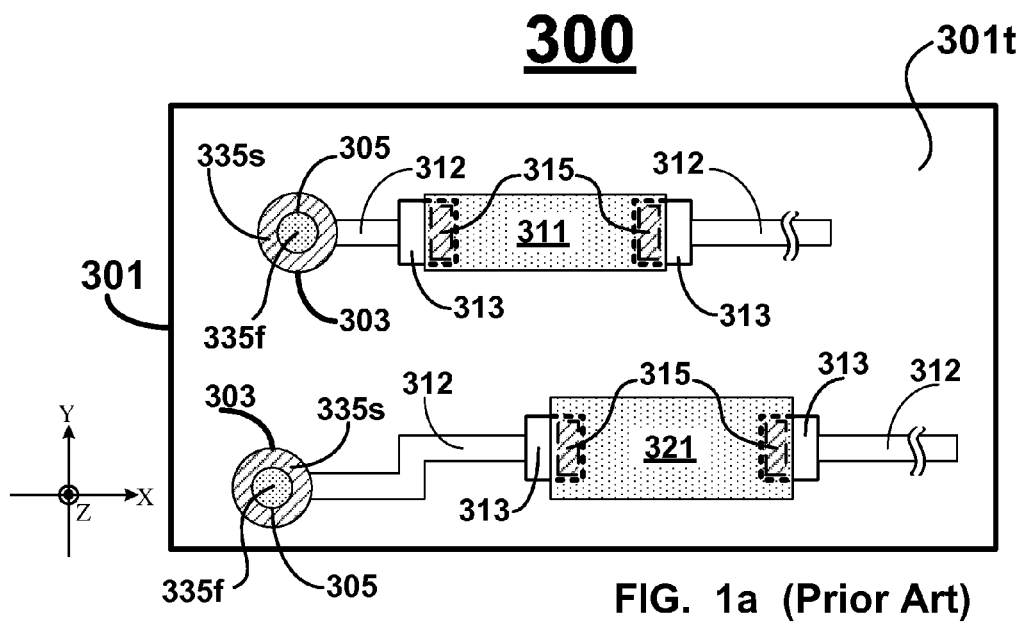
FIG. 1a (Prior Art)
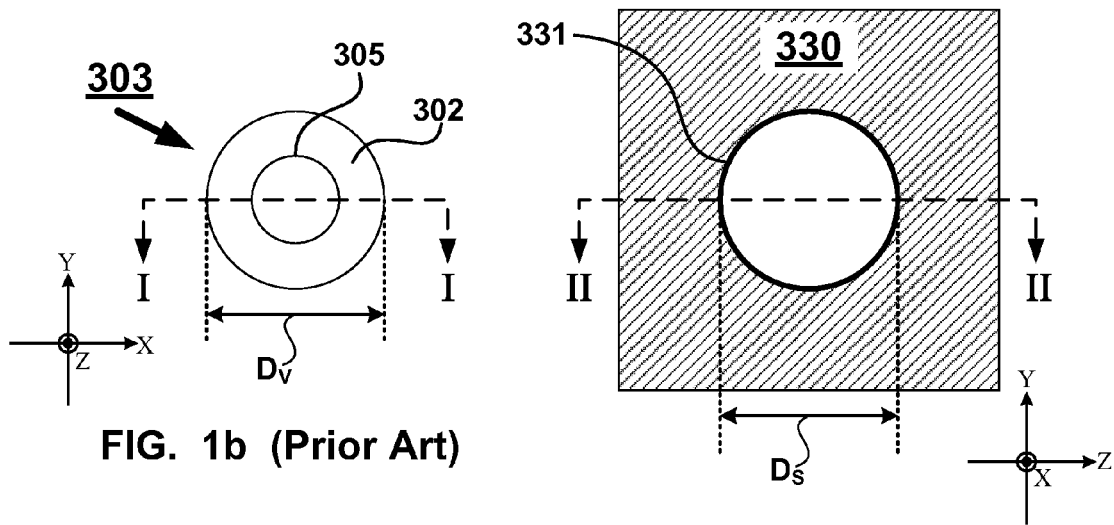
FIG. 1b (Prior Art)
FIG. 1c (Prior Art)

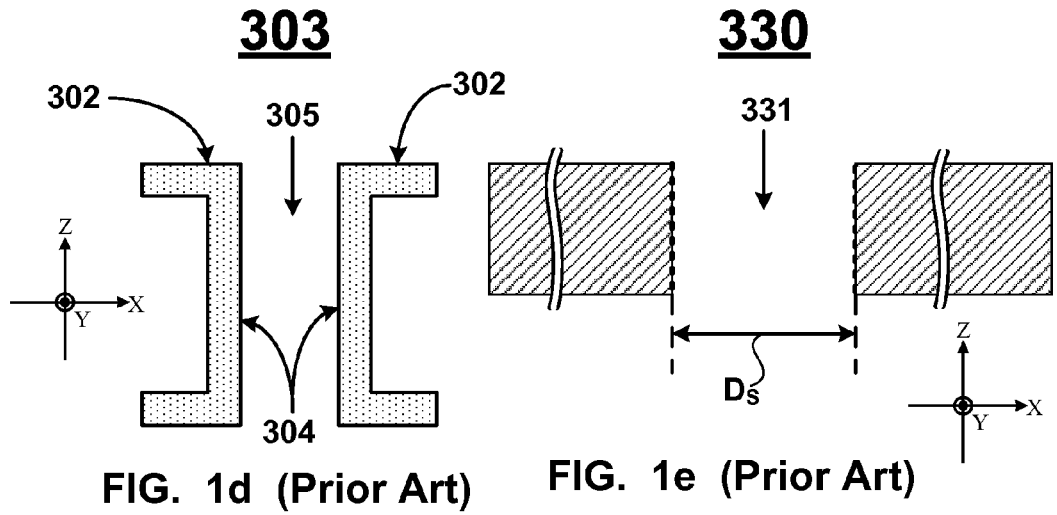
FIG. 1d (Prior Art)   FIG. 1e (Prior Art)
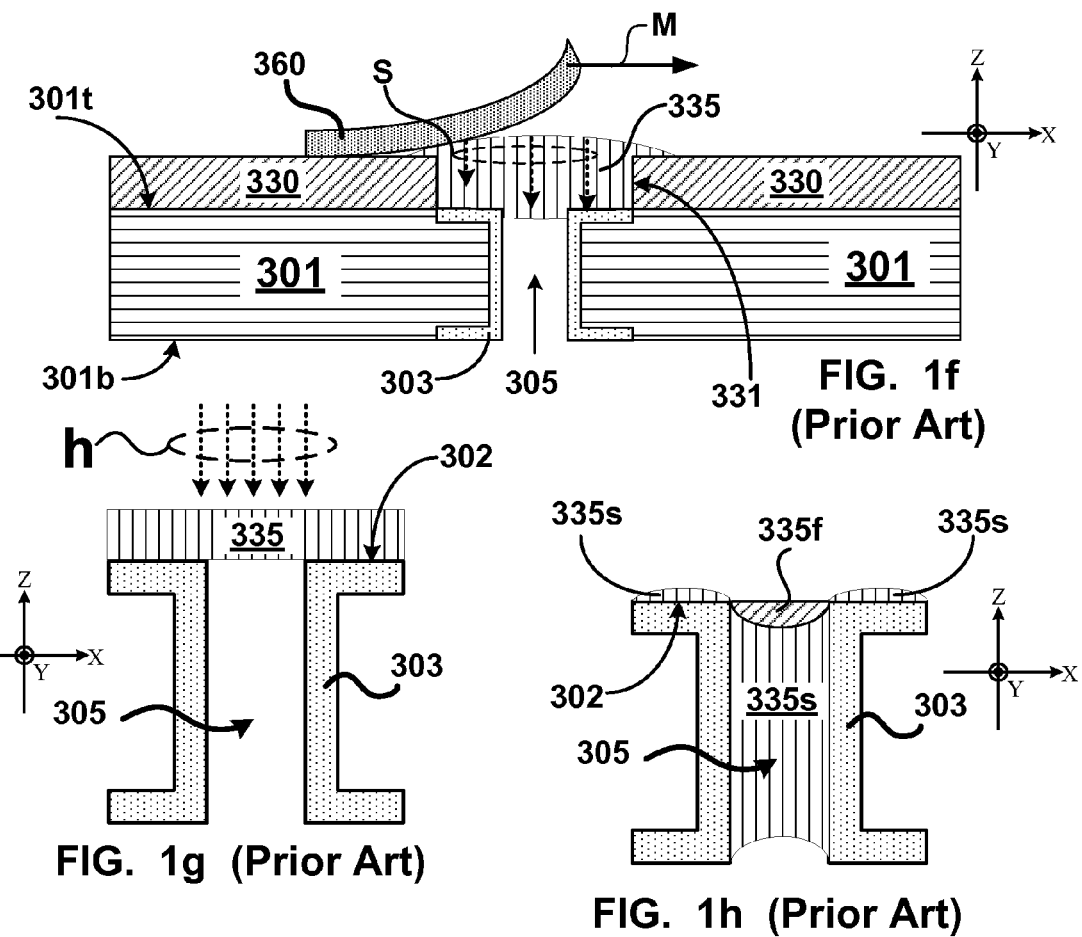
FIG. 1f (Prior Art)
FIG. 1g (Prior Art)   FIG. 1h (Prior Art)

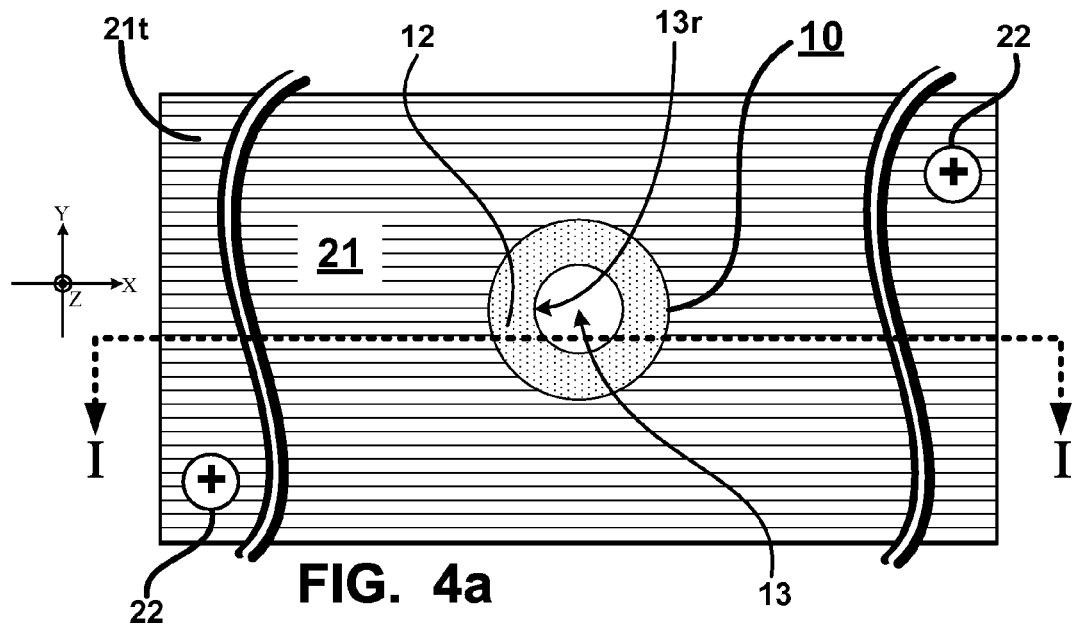
FIG. 4a
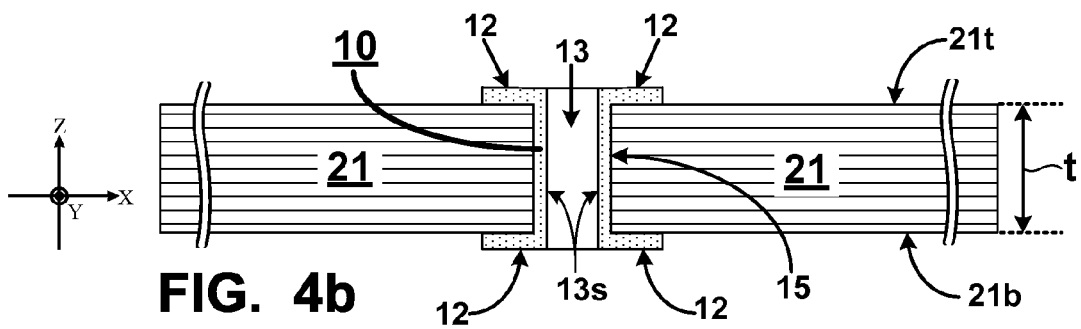
FIG. 4b
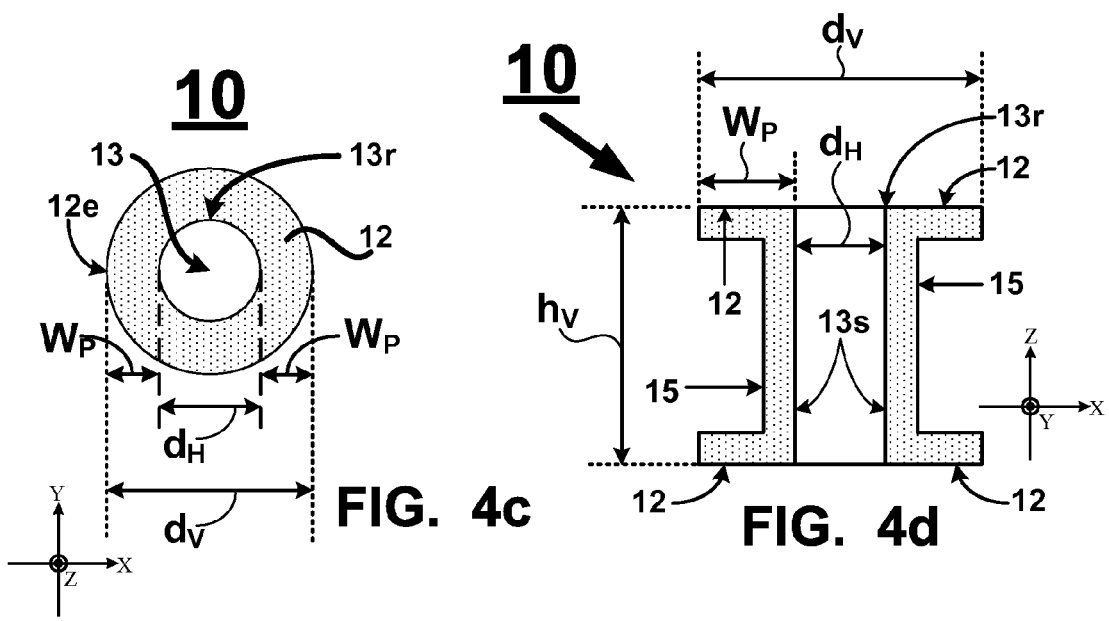
FIG. 4c
FIG. 4d

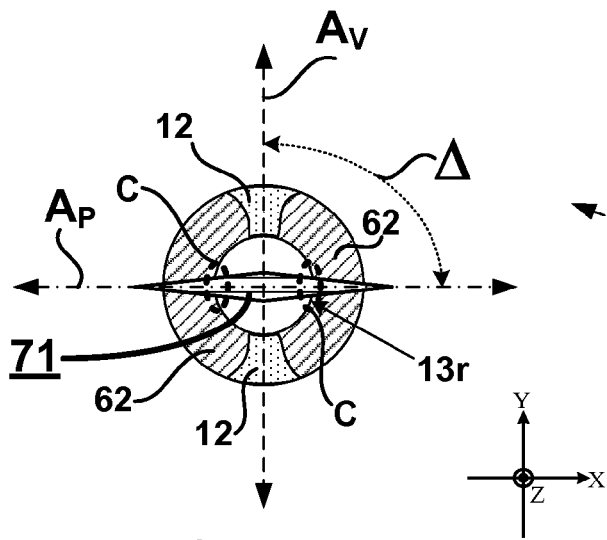
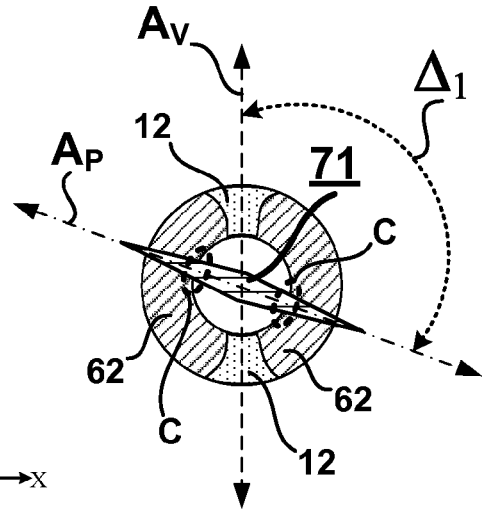
FIG. 9a  FIG. 9b
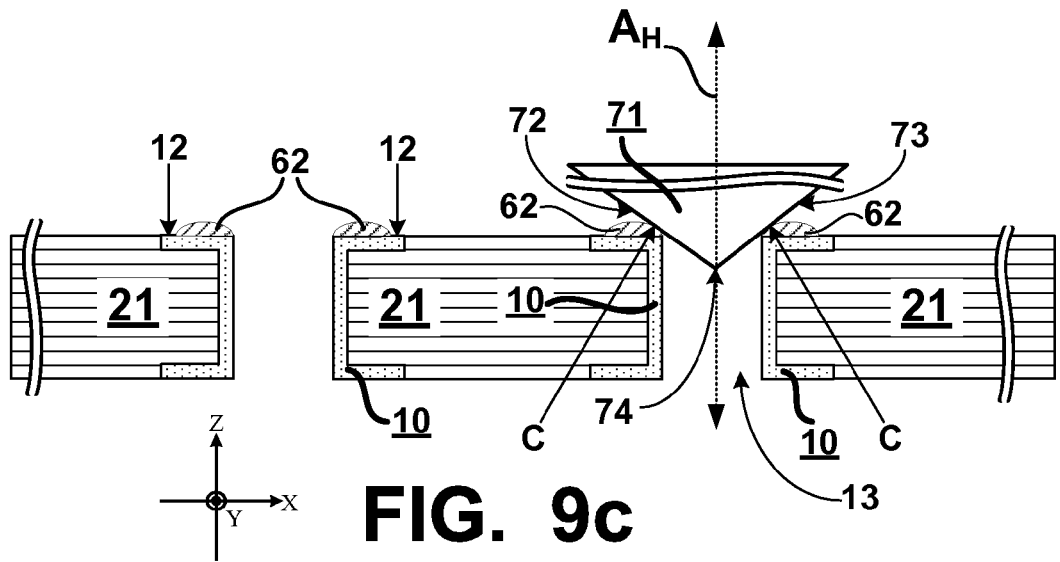
FIG. 9c
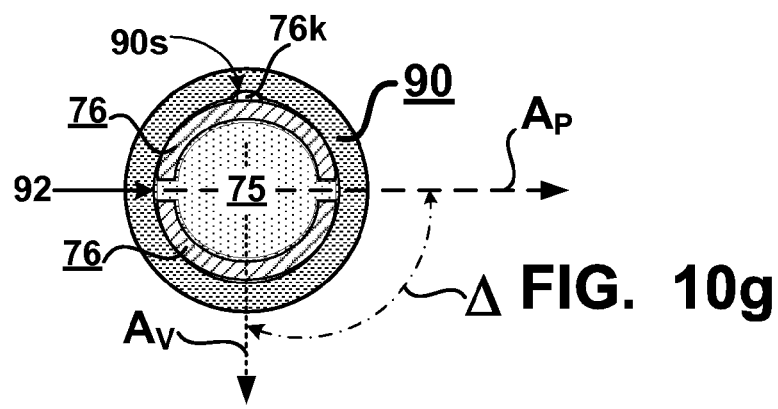
FIG. 10g

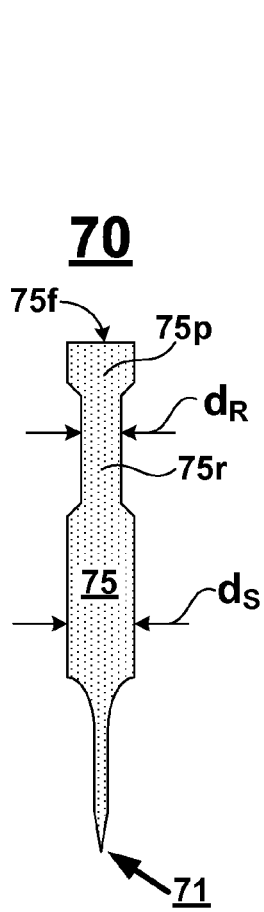
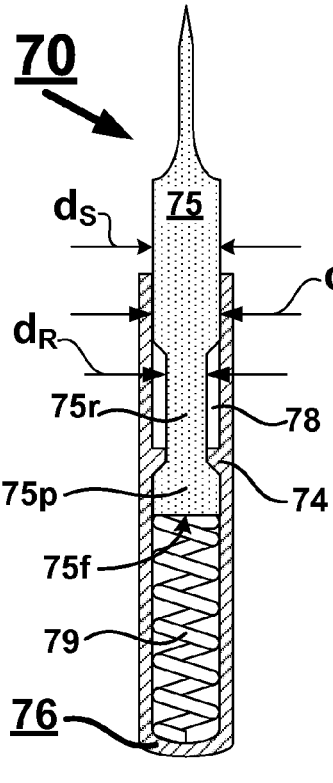
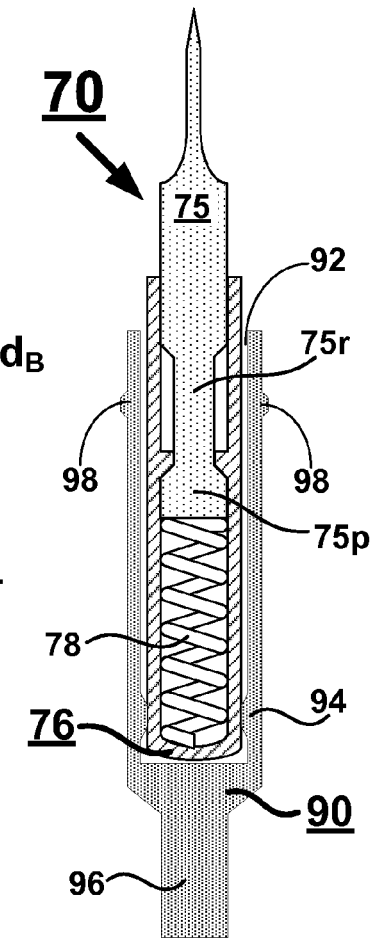
FIG. 10a
FIG. 10b
FIG. 10c
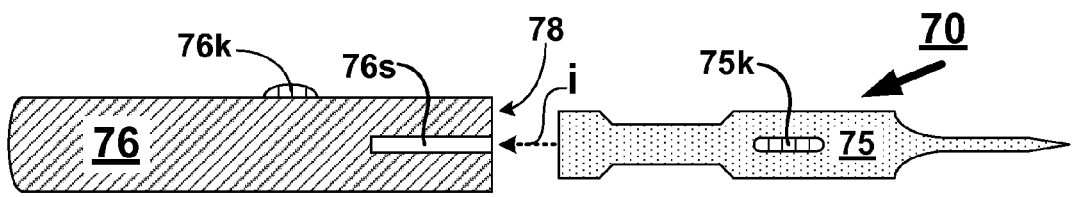
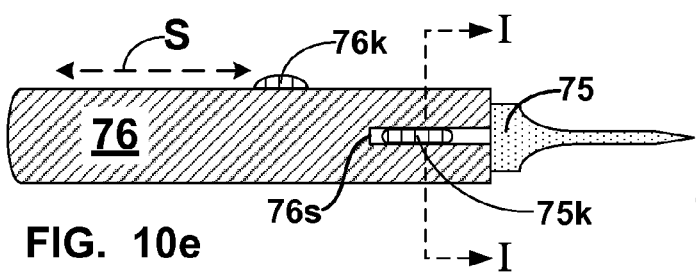
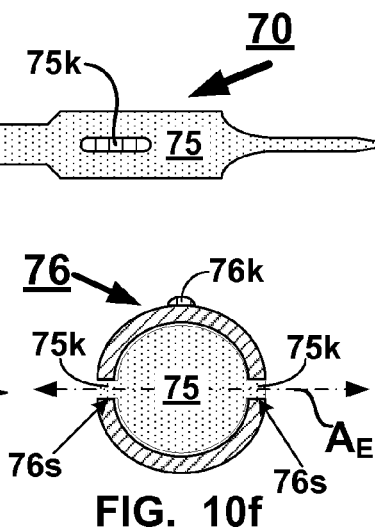
FIG. 10d
FIG. 10e
FIG. 10f

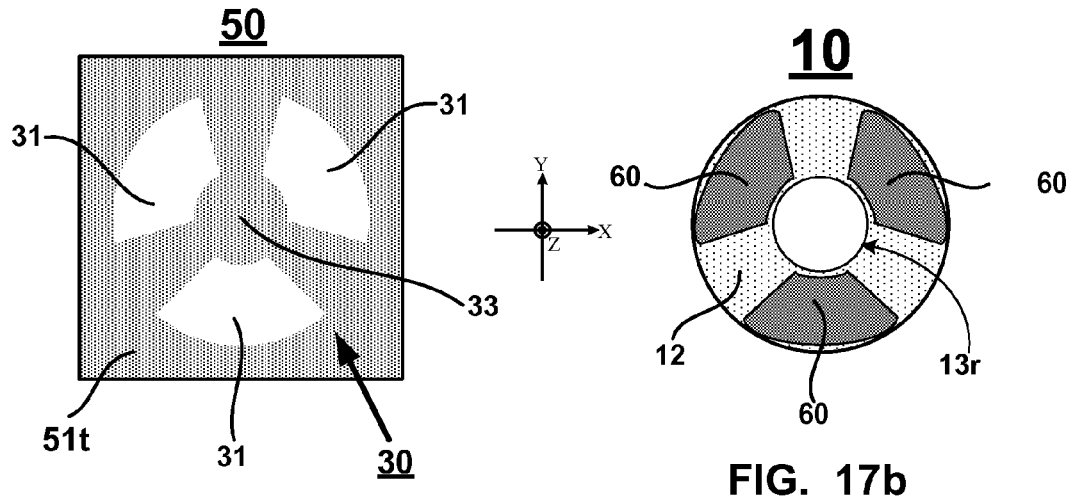
FIG. 17a
FIG. 17b
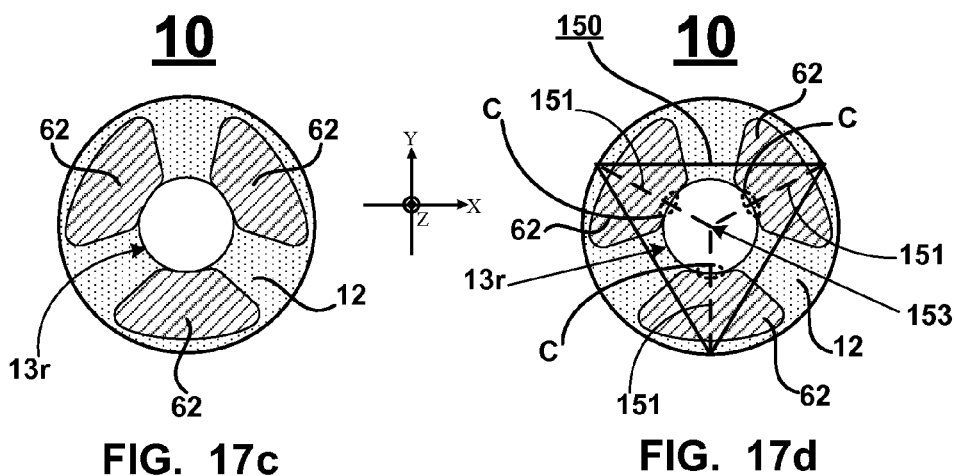
FIG. 17c
FIG. 17d
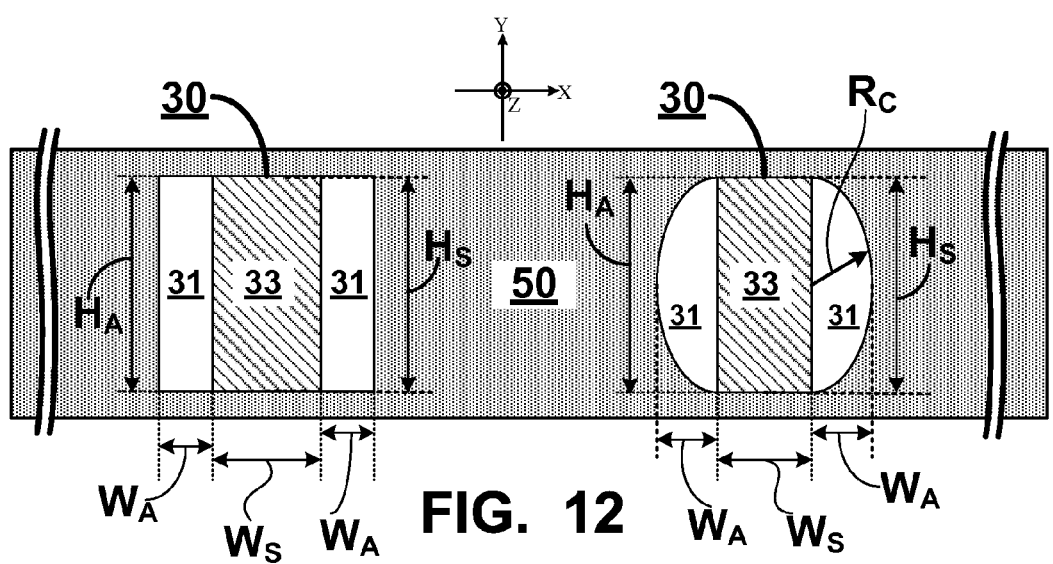
FIG. 12

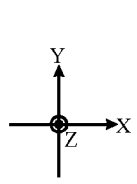 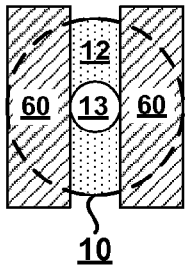 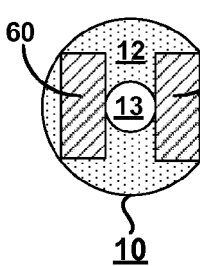 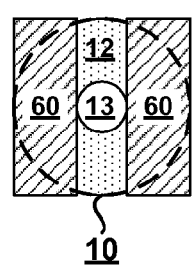 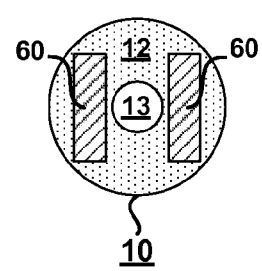
FIG. 13a  FIG. 13b  FIG. 13c  FIG. 13d
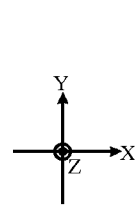 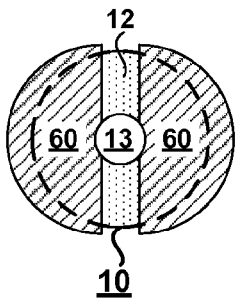 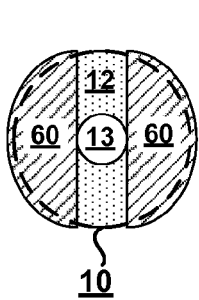 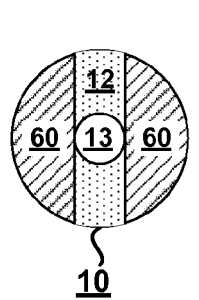 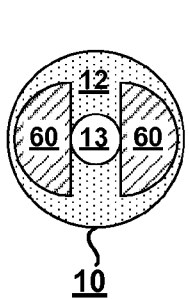
FIG. 14a  FIG. 14b  FIG. 14c  FIG. 14d
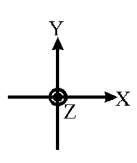 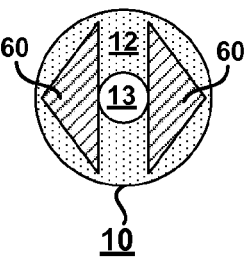 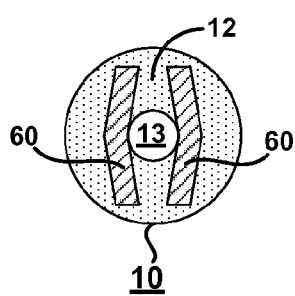 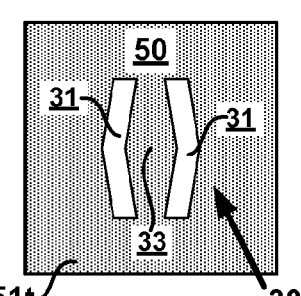
FIG. 15a  FIG. 15b  FIG. 15c
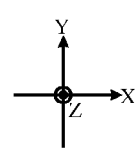 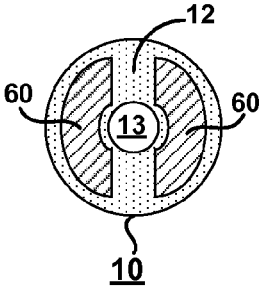 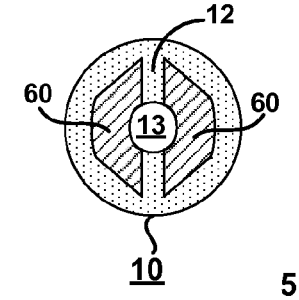 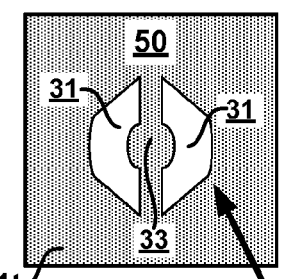
FIG. 16a  FIG. 16b  FIG. 16c

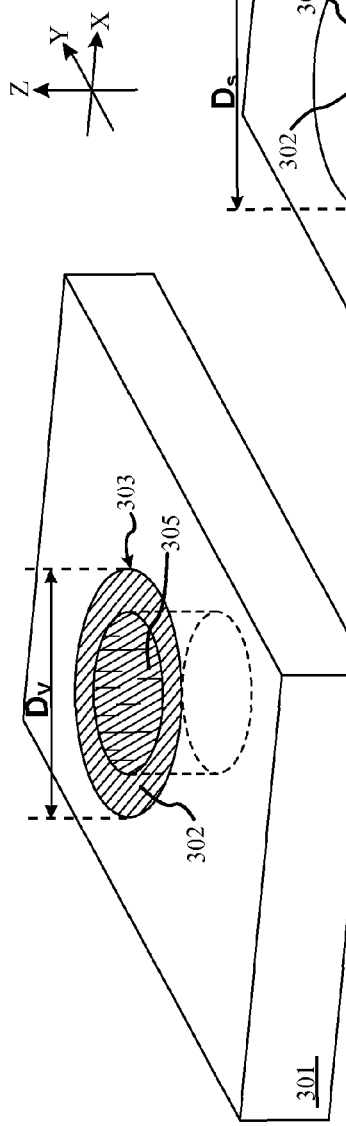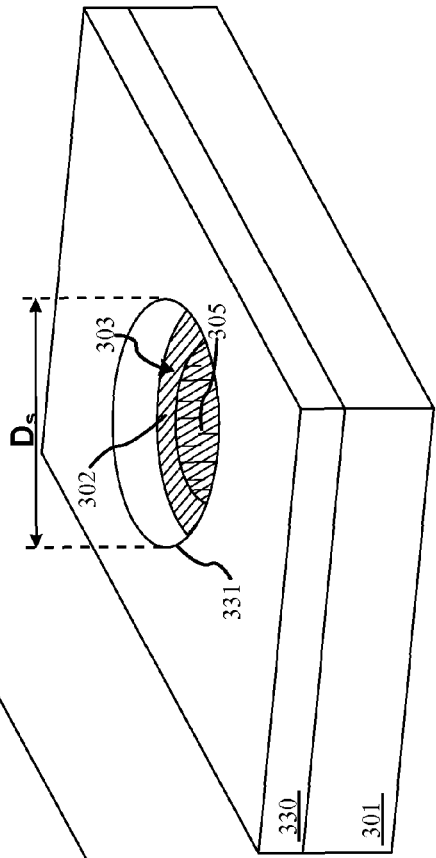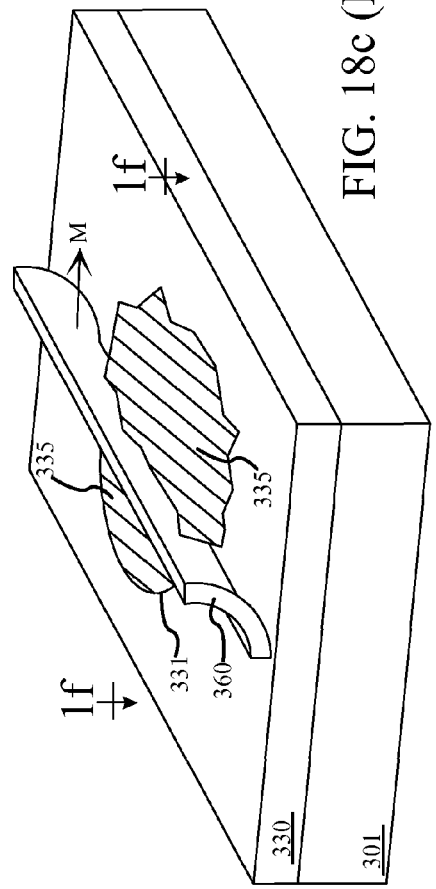
FIG. 18a (Prior Art)
FIG. 18b (Prior Art)
FIG. 18c (Prior Art)

US 7,954,693 B2

METHOD OF TREATING AND PROBING A VIA

RELATED APPLICATIONS

This application is a divisional of application Ser. No. 11/112,016, now U.S. Pat. No. 7,461,771 filed on Apr. 22, 2005, which is incorporated herein by reference.

FIELD OF THE INVENTION

The present invention relates generally to a method of treating a via and a method of probing a via. More specifically, the present invention relates to a method of treating a via with a lead-free solder paste that covers only a portion of a surface area of a pad of the via and a method of probing a lead-free solder on the pad using a blade probe.

BACKGROUND OF THE INVENTION

Lead (Pb) is a heavy metal that is well known for its toxicity to humans. Lead poisoning in humans can occur by skin contact, breathing, eating, or drinking materials that contain lead. Lead containing products such as paint, plumbing, and gasoline have been banned in many countries including the U.S. and countries in the European Union (EU). Children are particularly susceptible to lead poisoning and lead poisoning can cause developmental problems in children, such as learning disabilities, neurological damage, anemia, stunted growth, behavioral disorders, impaired speech development, loss of hearing, renal damage, and hyperactivity, just to name a few. Once lead is introduced into a bio-system, it is almost impossible to get rid of because lead does not dissolve in water, is not biodegradable, cannot be burned off, and does not dissipate or decay in concentration over time.

A primary source of lead poisoning in humans is through groundwater contamination from products or materials that contain lead. For example, landfills often contain electronic products that have been dumped in the landfill. Those electronic products include circuit boards on which components have been soldered using a lead-based solder. The elements tin (Sn) and lead (Pb) are key components in the lead-based solder (e.g. a lead-tin solder) and the lead-tin solder itself is a fundamental material for electrically connecting and joining a component to a circuit board. Eventually, rain and other environmental factors cause the lead (Pb) in the lead-tin solder to leach out into the groundwater.

Although lead-tin solder accounts for a small percentage (<1%) of worldwide lead consumption, the proliferation of electronic products, especially consumer electronics products, that are purchased and then later discarded in landfills, has prompted many countries to enact legislation that bans the use of lead-tin solder. For example, Japan and the EU have pending legislation that will restrict the use of lead-tin solder. The EU Restrictions on Hazardous Substances (RoHS) will take effect on Jul. 1, 2006. These restrictions on lead-tin solder will not only impact electronics manufactures in the enacting nations, but also electronics manufactures who trade goods with those nations. In either case, manufactures in the electronics industry are faced with developing an economically viable and environmentally friendly substitute for lead-tin solder that complies with the no-lead restrictions.

Currently, a lead-free solder is being considered as a replacement for lead-tin solder. Examples of a composition of the lead-free solder include: (1) 99.3% tin (Sn) and 0.7% copper (Cu); (2) 95.5% tin (Sn), 4.0% silver (Ag), and 0.5% copper (Cu); and (3) 92.3% tin (Sn), 3.4% silver (Ag), 1.0% copper (Cu), and 3.3% bismuth (Bi). However, there are some implementation problems that arise from the use of lead-free solder that must be overcome so that manufacturing of electronics using lead-free solder is economically viable. One such problem is an increased contact failure rate during in-circuit-test (ICT) of vias on PC boards. Typically, a PC board will include several test vias that include a lead-free solder on a pad of the via. The vias are probed by a test fixture after a reflow soldering of components to the PC board. The probing is necessary to ensure that the PC board and the components connected with it are functioning properly. A lead-free solder is easier to probe than a bare finished metal with the exception that vias pose a problem because a flux residue coats the via after reflow and the residue serves as an insulating barrier that prevents electrical contact between the probe and the lead-free solder on the via.

Turning to FIG. 1a, a prior electronic circuit 300 includes a PC board 301 including components (311, 321) that are soldered 315, using a lead-free solder, to pads 313 that are positioned on a surface 301t of the board 301. The dashed outline depicts a portion under the components (311, 321) where the lead-free solder is reflowed to connect the components (311, 321) to their respective pads 313. The components (311, 321) can be surface mount devices, such as resistors, capacitors, and integrated circuits, for example. Electrically conductive traces 312 connect the components (311, 321) to other elements (not shown) that form the electronic circuit 300. A via 303 is one such element that can be connected with the components (311, 321) by the traces 312. As will be described below, a lead-free solder paste is applied to the vias 303 and the pads 313. The lead-free solder paste includes a lead-free solder component and a flux component. After a reflow soldering process, a pad 302 is covered by a lead-free solder 335s and a hole 305 of the via 303 is substantially filled with the solder 335s. The solder 335s includes a divot that is capped by a flux 335f that is recessed in the divot. The lead-free solder 335s also serves to solder the components (311, 321) to their respective pads 313 as denoted by 315.

To facilitate the description and inter-relation between figures, a coordinate system with three axes orthogonal to one another is provided as shown in FIG. 1. The axes intersect mutually at the origin of the coordinate system which is intended to be the center of the via 303. The axes in all figures are offset from their actual locations for clarity of illustration. Moreover, FIGS. 1a~1c are understood to be a plan view of the electric circuit 300 and PC board 301 (FIG. 1a), via 303 (FIG. 1b) and stencil 330 (FIG. 1c) according to the YX-plane. FIGS. 1d~1h are cross sectional views of the PC board 301, via 303 and stencil 330 according to the ZX-plane. Similar comparisons may be made for the figures as well.

Reference is now made to FIGS. 1b through 1e, where the via 303 includes a diameter $D_V$ and a stencil 330 that is used as a mask to apply the aforementioned lead-free solder paste to the via 303 includes an aperture 331 that has a diameter $D_S$. Typically, as was done when lead-based solder was used to solder components to a PC board, a one-to-one pasting (1:1) of a solder paste to the via was accomplished by using a stencil with an aperture that had a diameter that was greater than or equal to the diameter of the via. Accordingly, in FIG. 1c, the diameter $D_S$ of the prior stencil 330 would be greater than or equal to the diameter $D_V$ (i.e. $D_S \geq D_V$) of the via 303 in FIG. 1b.

Consequently, the diameter $D_S$ of the aperture 331 completely covers the pad 302 of the via 303 as depicted in FIG. 1f, where the stencil 330 is positioned in contact with the surface 301t of the board 301 and a lead-free solder paste 335 is applied to the stencil 330 and flows through the aperture 331 and covers the pad 302 of the via 303. Subsequently, heat h is applied to the lead-free solder paste 335 during a reflowing process. The reflowing causes a solder component 335s of the paste 335 to wet and adhere to the pad 302. Additionally, a substantial portion of the solder 335s flows into the hole 305 of the via and a flux component 335f of the paste 335 also flows into the hole 305. As a result, the solder 335s fills up a substantial portion of the hole 305 and the flux 335f pools on top of the solder 335s and plugs the hole 305. The plugging of the hole 305 and the pooling of the flux 335f are due to a higher solids content of the flux 335f used in the lead-free solder paste 335 and to the aforementioned 1:1 pasting of the lead-free solder paste 335 to the via 303.

With respect to the above description, the prior art method of 1:1 pasting may be more fully appreciated with respect to FIGS. 18a~18e. Specifically, FIGS. 18a~18e provide a perspective view to interrelate the top pan views of FIGS. 1b and 1c, and the cross sectional views along I-I and II-II of FIGS. 1d and 1e and the cross sectional view of the pasting process presented in FIGS. 1f~1h.

More specifically, FIG. 18a illustrates the PC board 301 having via 303 disposed therein such that pad 302 is exposed upon the surface of the board 301 and hole 305 extends into the board 301. As in FIG. 1b, via 303 had diameter $D_V$. In FIG. 18b, stencil 330 is shown disposed upon board 301 and aligned to via 303. As in FIG. 1c, stencil 330 provides aperture 331 having diameter $D_S$, the aperture 331 aligned directly upon via 303. As $D_S \geq D_V$ the pad 302 and hole 305 of via 303 are fully exposed through aperture 331.

FIG. 18c corresponds generally to FIG. 1f, and shows lead free solder paste 335 applied to the stencil 330 being urged into the aperture 331 to cover the pad 302 and hole 305 of via 303. In at least one embodiment, a blade 360 serves to facilitate the uniform flow of paste 335 into the aperture 331. In FIG. 18d, the stencil 330 has been removed. As shown, the lead free solder paste 335 is a continuous mass, i.e. a disc, disposed upon the via 303 and covering pad 302.

Upon the subsequent application of heat h to paste 335 during the reflow process, the solder component 335s of the paste 335 is caused to wet and adhere to the pad 302 (see FIG. 18e). With respect to the size of the disc of paste 335, the surface area of pad 302 is small. As such a substantial portion of the solder 335 will flow into the hole 305 and the flux 335f component will pool on top of the solder 335s within the hole 305. As is shown in FIG. 18e, this results in a contiguous ring of solder 335s upon pad 302 circumferentially about the plugged hole 305 now having a top layer of pooled flux 335f, that may be generally flat, concave or convex. Moreover, the solder 335s sections shown in the cross section view of FIG. 1h are not separate and distinct sections, but correspond to dotted line areas 1800 and 1800' in FIG. 18e as cross sections of a contiguous ring of solder 335s.

Because of the 1:1 pasting, more solder paste 335 than is needed is applied to the pad 302. During the reflowing, that excess solder 335s in the paste 335 flows into the hole 305. As a result, the flux 335f pools on top of the excess solder 335s in the hole 305 as depicted in FIGS. 1i and 1j. The flux 335f can be substantially flush with a top surface of the pad 302 or the flux 335f can form a convex or a concave dome 335fc that is positioned above or below the top surface of the pad 302. In either case, a tip 350t of a probe 350 that is urged u into contact with the via 303 is not able to make an electrical connection C with the solder 335s on the pad 302 because the tip 350t cannot penetrate far enough into the hole 305 due to the blockage caused by the flux 335f. Consequently, a contact surface 350c of the probe cannot connect with the solder 335s on the pad 302 and an electrical continuity cannot be reliably established between the probe 350 and the via 303. Moreover, the vias 303 are typically coated with an organic solderability preservative (OSP) prior to the applying of the solder paste 335. The OSP is a low cost coating that if left overpasted also prevents repeatable contact with the via 303.

Returning to FIG. 1a, after the reflowing of the solder paste 335, it is desirable to probe the board 301 to perform an in-circuit-test (ICT) to verify proper functioning of the board 301. However, the flux 335f pooling in the hole 305 prevents a reliable ICT using the probe 350 as was depicted in FIG. 1j. Essentially, the probe 350 fails to make a good electrical connection in high percentages with the solder 335s on the pad 302. The inability to repeatedly perform a reliable ICT on the board 301 results in an increased manufacturing cost for re-testing of lead-free solder treated boards, waste cost associated with boards that are mistakenly scrapped, increase liability exposure during a warranty period for products that contain bad boards, a negative impact on brand loyalty caused by defective products, and costs associated with troubleshooting the boards and the ICT functional testers used to probe the boards.

Potential solutions to the above problems include using a higher cost board finish and using test pads instead of test vias. The use of a higher cost finish (e.g. electrolytic Ni/Au) is not acceptable for volume manufacturing, particularly for low margin consumer electronics products. Other notable finishes such as immersion tin and immersion silver may lead to whisker growth and failure mechanism associated with whisker growth. The use of test pads versus test vias has the disadvantage of using up precious real estate on the PC board and adding capacitance to the signal net that can compromise signal speed, performance, and reliability. An additional solution is to chemically wash the boards; however, washing adds cost and the chemicals used create environment problems of their own.

Consequently, there is a need for a method of treating a via with a lead-free solder that prevents solder and flux from plugging up a hole of the via. Moreover, there exists a need for a method of treating a via with a lead-free solder that eliminates an overpasting of the via and reduces an amount of a lead-free solder paste that is applied to a pad of the via. Finally, there is also a need for a method of probing a via that has been treated with lead-free solder that provides reliable and repeatable probing of the via for in-circuit-test.

SUMMARY OF THE INVENTION

A method of treating a via connected with a substrate includes aligning a stencil with the substrate. The stencil includes a pattern with a plurality of apertures and a shield. The stencil is connected with the substrate so that the shield covers a hole and a first portion of a pad of the via and the apertures are positioned over a second portion of the pad. A lead-free solder paste is applied to the stencil to print the lead-free solder paste only on the second portion of the pad. The shield prevents the lead-free solder paste from entering the hole of the via. The stencil is removed from the substrate and the lead-free solder paste is reflowed so that a flux drains through the hole and a lead-free solder wets only a portion of a surface area of the pad. The aperture in the stencil reduces the amount of the lead-free solder paste applied to the pad so that upon reflowing, substantially all of the lead-free solder in the paste wets the pad and the flux in the paste drains through the hole without plugging up the hole.

A method of probing a via that is connected with a substrate and including a lead-free solder that is connected with a portion of a pad of the via and is positioned on opposite sides of a hole of the via includes aligning a test fixture with the substrate. The test fixture includes a blade probe connected with the test fixture in a preferred orientation and the blade probe includes a shaft, a tip, and first and second edges that are collinear with each other. The preferred orientation of the blade probe and the aligning of the test fixture with the substrate are operative to position a portion of the first and second edges to make a contact with a portion of the lead-free solder on the pad when the blade probe is urged into contact with the lead-free solder. The via is probed by urging the blade probe into contact with the lead-free solder on the pad. The blade probe allows for reliable and repeatable probing of the via during an in-circuit-test.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 1a is a top-plan view depicting a prior electrical circuit with a via plugged by a flux and a lead-free solder from prior a lead-free solder process.

FIGS. 1b and 1c are top plan views depicting a prior via and a prior stencil used for pasting the via respectively.

FIG. 1d and FIG. 1e are cross-sectional views along dashed lines II and IIII of FIG. 1b and FIG. 1c respectively.

FIG. 1f is a cross-sectional view depicting a prior lead-free solder pasting process.

FIG. 1g is a cross-sectional view depicting a prior lead-free solder paste applied to a pad and covering a hole of a via during a reflowing process.

FIG. 1h is a cross-sectional view of the via of FIG. 1g after the reflowing process and depicts a hole plugged by lead-free solder and pooled flux.

FIG. 4a is a top plan view depicting a via connected with a substrate.

FIG. 4b is a cross-sectional view along a dashed line I-I of FIG. 4a.

FIGS. 4c and 4d are a top plan view and a cross-sectional view respectively of a via.

FIG. 5b is a cross-sectional view along a dashed line IIII of FIG. 5a.

FIG. 6c is a cross-sectional view depicting an applying of a lead-free solder paste to a stencil.

FIG. 9a is a top plan view depicting a preferred orientation of a blade probe relative to a lead-free solder on a second portion of a pad of a via.

FIG. 9b is a top plan view depicting an alternative orientation of a blade probe relative to a lead-free solder on a portion of a surface area of a pad of a via.

FIG. 9c is a cross-sectional view depicting a contact of a first edge and a second edge of a blade probe with a lead-free solder on a pad of a via.

FIG. 10a depicts a shaft of a blade probe that includes a plunger body and a plunger tail.

FIG. 10b is a cross-sectional view depicting a barrel and the blade probe of FIG. 10a positioned in the barrel.

FIG. 10c is a cross-sectional view depicting the barrel of FIG. 10b positioned in a receptacle.

FIGS. 10d through 10f depict one example of a structure for connecting a blade probe with a barrel so that a probe axis is disposed in a preferred orientation.

FIG. 10g depicts one example of a structure for connecting a barrel with a receptacle with a probe axis disposed in a preferred orientation.

FIG. 12 is a top plan view of a stencil and depicts examples of patterns for pasting a lead-free solder paste on a second portion of a pad of a via.

FIGS. 13a through 13d are top plan views depicting examples of a rectangular shape of a lead-free solder paste applied to a second portion of a pad of a via.

FIG. 14a through 14d are top plan views depicting examples of an arcuate shape of a lead-free solder paste applied to a second portion of a pad of a via.

FIG. 15a through 15b are top plan views depicting examples of an angular shape of a lead-free solder paste applied to a second portion of a pad of a via.

FIG. 15c is a top plan view depicting a stencil with a pattern for forming the angular shape of the lead-free solder paste depicted in FIG. 15b.

FIG. 16a through 16b are top plan views depicting examples of a complex shape of a lead-free solder paste applied to a second portion of a pad of a via.

FIG. 16c is a top plan view depicting a stencil with a pattern for forming the complex shape of the lead-free solder paste depicted in FIG. 16b.

FIG. 17a is a top plan view depicting a stencil including three apertures and a shield.

FIG. 17b is a top plan view depicting a pad of a via printed with a lead-free solder paste using the stencil of FIG. 17a.

FIG. 17c is a top plan view depicting a lead-free solder on three portions of a pad of a via.

FIG. 17d is a top plan view depicting a chisel type probe probing a lead-free solder on a pad.

FIGS. 18a-18e provide a perspective view of a via, board, paste and prior art reflow process corresponding generally to FIGS. 1b~1h.

DETAILED DESCRIPTION

Figure 1I:
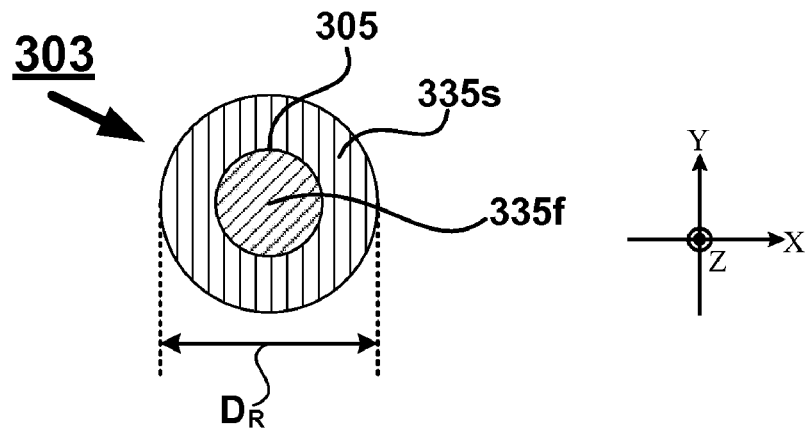
FIG. 1i is a top plan view of the via depicted in FIG. 1h.
Figure 1J:
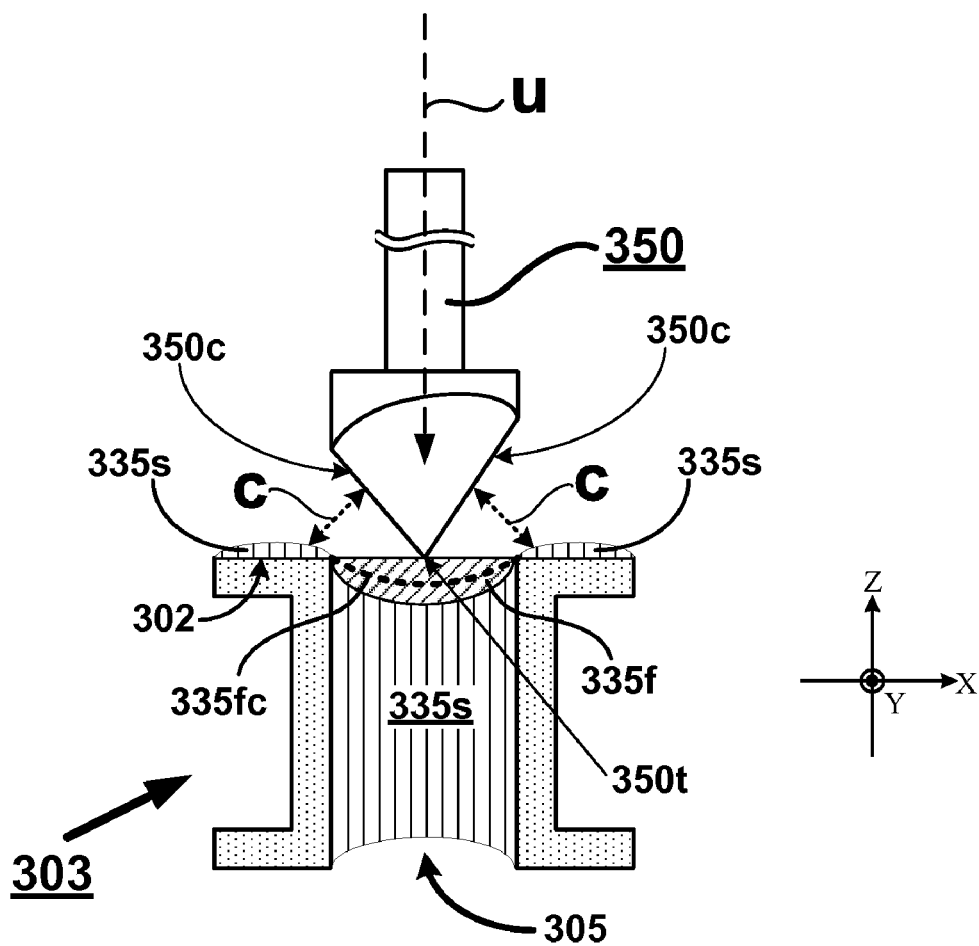
FIG. 1j is a cross-sectional view depicting a prior probe that is probing a via that includes a hole plugged by lead-free solder and pooled flux.

In the following detailed description and in the several figures of the drawings, like elements are identified with like reference numerals.

As shown in the drawings for purpose of illustration, the present invention is embodied in a method of treating a via connected with a substrate. The method includes aligning a stencil with the substrate. The stencil includes a pattern with a plurality of apertures and a shield. The stencil is connected with the substrate so that the shield covers a hole of the via and a first portion of a pad of the via and the apertures are positioned over a second portion of the pad. A lead-free solder paste is applied to the stencil to print the lead-free solder paste only on the second portion of the pad. The shield prevents the lead-free solder paste from entering the hole of the via. The stencil is removed from the substrate and the lead-free solder paste is reflowed so that a flux drains through the hole and a lead-free solder wets only a portion of a surface area of the pad.

The present invention also embodies a method of probing a via that is connected with a substrate and including a lead-free solder that is connected with a portion of a pad of the via and is positioned on opposite sides of a hole of the via. The method includes aligning a test fixture with the substrate. The test fixture includes a blade probe connected with the test fixture in a preferred orientation and the blade probe includes a shaft, a tip, a first edge, and a second edge. The first and second edges are collinear with each other. The preferred orientation of the blade probe and the aligning of the test fixture with the substrate are operative to position a portion of the first and second edges to make a contact with a portion of the lead-free solder on the pad when the blade probe is urged into contact with the lead-free solder. The via is probed by urging the blade probe into contact with the lead-free solder on the pad.

As with the prior art illustrations of FIGS. 1a~1j, to facilitate the description and inter-relation between figures, a coordinate system with three axes orthogonal to one another is provided with the accompanying figures illustrating embodiment(s) of the present invention. The axes intersect mutually at the origin of the coordinate system which is intended to be the center of the via 10, or the center of a probe oriented to contact the via 10. The axes in all figures are offset from their actual locations for clarity of illustration. Moreover, FIGS. 4a and 4c are understood to be a plan view of the substrate 21 and via 10 according to the YX-plane and FIGS. 4b and 4d are cross section views of the via 10 according to the ZY-plane.

Referring to FIG. 2 and FIGS. 4a through 4d, a method 100 of treating a via 10 connected with a substrate 21 includes at a stage 103, aligning a stencil with the substrate. In FIG. 4a, the via 10 is connected with the substrate 21. Materials for the substrate 21 include but are not limited to a material used for printed circuit boards (PCB hereinafter). Additionally, the substrate 21 can include one or more fiducial marks 22 that may be used to facilitate aligning a stencil with the substrate as will be described below. The via 10 can be a through hole via (as depicted) in which a hole 13 of the via extends between a top surface $21t$ and a bottom surface $21b$ of the substrate 21 or the via 10 can be a blind via (not shown) in which the pad 12 is positioned only on one of the surfaces ($21t$, $21b$) and the hole 13 extends partially into the via 10 but does not extend between the surfaces ($21t$, $21b$).

In FIG. 4b, the via 10 includes the hole 13, an interior surface $13s$ of the hole 13, a rim of the hole $13r$, at least one pad 12, and an exterior surface 15 that may be connected with one or more electrically conductive traces (not shown). The pad 12 may also be connected with one or more electrically conductive traces (not shown). The via 10 can be formed in the substrate 21 using processes that are well understood in the electronics art. Moreover, passive or active electrical components (not shown) may be connected with the via 10 by the aforementioned electrically conductive traces. The via 10 may be a test via that is probed to check a functionality of a circuit connected with the substrate 21.

In FIGS. 4c and 4d, the via 10 can include a pad width $W_P$ as measured from the rim $13r$ to an outer edge $12e$ of the pad 12, a via diameter $d_V$, and a hole diameter $d_H$. Typically the hole diameter $d_H$ is referred to as a finished hole size (FHS). For a through hole via, a height $h_V$ of the via 10 will typically be determined by a thickness t of the substrate 21. Actual dimensions for the via 10 will be application dependent; however, the following are typical ranges for hole and via diameters: the via diameter $d_V$ can be in a range from about 20.0 mil to about 60.0 mil; and the hole diameter $d_H$ can be in a range from about 8.0 mil to about 40.0 mil.

Figure 19B:
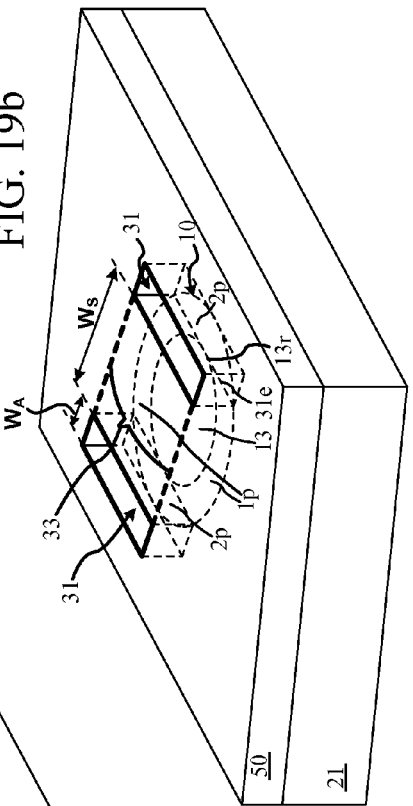
FIGS. 19a-19e provide a perspective view of a via, board, stencil with apertures, lead-free solder paste and reflow process corresponding generally to FIGS. 4a~7d in accordance with at least one embodiment.
Figure 19A:
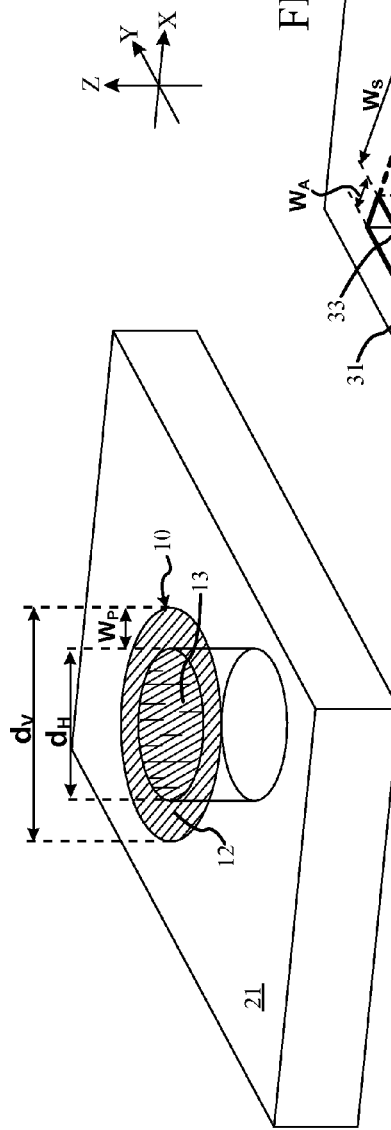

The relationship of the via 10 and the substrate 21 may be more fully appreciated with respect to FIG. 19a, which provides a perspective view of substrate 21 having via 10 disposed therein such that pad 12 is exposed upon the surface of the substrate 21 and hole 13 extends into the substrate 21. As in FIGS. 4c and 4d the via 12 has a diameter $d_V$, a hole diameter $d_H$ and a pad width $W_P$.

Figure 5A:
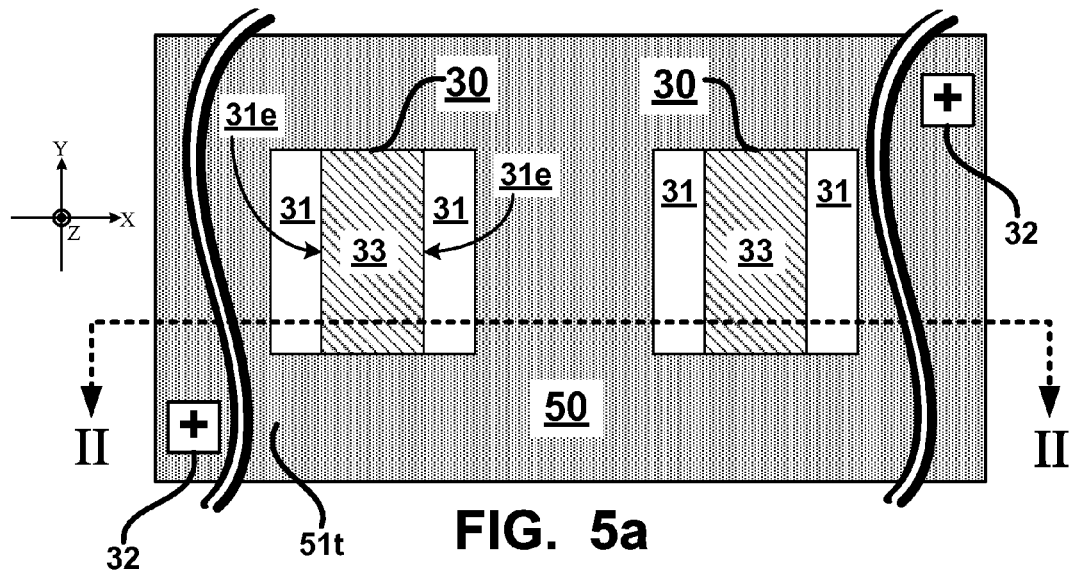
FIG. 5a is a top plan view depicting a stencil and a pattern that includes a plurality of apertures and a shield.
Figure 5B:
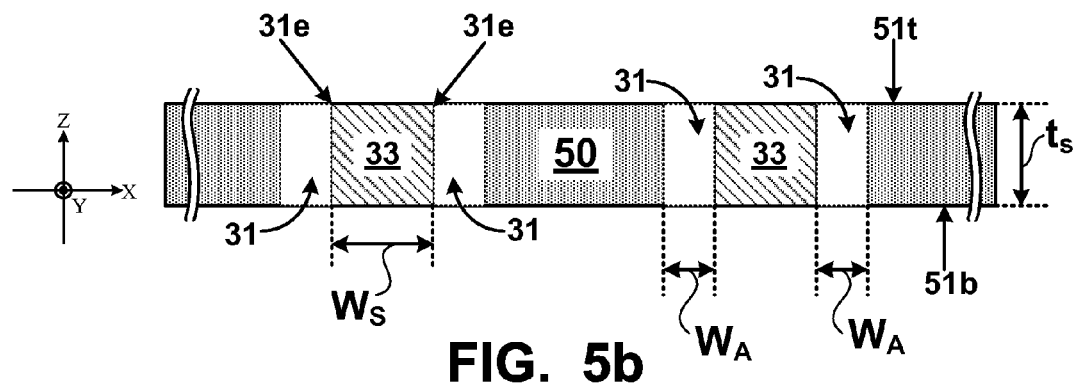

Turning now to FIGS. 5a and 5b, a stencil 50 includes a pattern 30 with a plurality of apertures 31 and a shield 33. The apertures 31 extend between a top surface $51t$ and a bottom surface $51b$ of the shield 50. Although the shield 33 is depicted in hashed outline, the shield 33 can be made from the same material as the stencil 50 and the apertures 31 can be formed using a process such as stamping, cutting, laser cutting, punching, or perforating, for example. An edge $31e$ of the apertures 31 that are adjacent to the shield 33 may be aligned with the rim $13r$ in the hole 13 as will be described below. The stencil 50 can be made from the same materials that are customarily used for forming stencils for the printing of a lead-free solder paste on the vias and pads of a PCB. The stencil 50 may also include one or more fiducial marks 32 that may be used to facilitate aligning the stencil 50 with the substrate 21 as will be described below.

The shapes of the apertures 31 and the shield 33 will be application specific and are not limited to the rectangular shapes depicted herein. Factors that can determine the shape of the apertures 31 and the shield 33 include but are not limited to a shape of the pad 12, the via diameter $d_V$, the hole diameter $d_H$, a surface finish on the pad 12, and a composition of the lead-free solder paste to be printed on the pad 12. A shape of the apertures 31 can include but is not limited to a rectangular shape, an arcuate shape, an angular shape, and a complex shape. Similarly, a shape of the shield 33 can include but is not limited to a rectangular shape, an arcuate shape, an angular shape, and a complex shape. For the discussion that follow, the apertures 31 and the shield 33 will have a rectangular shape.

Figure 5C:
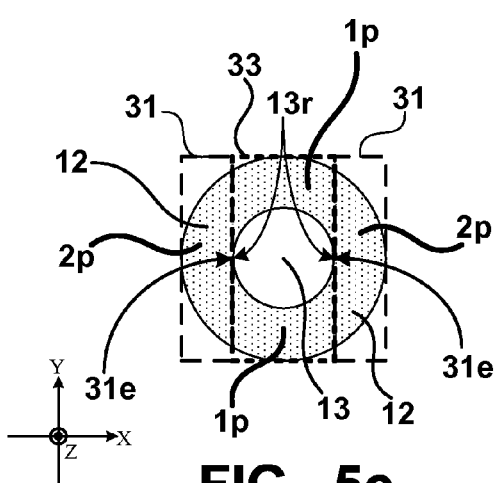
FIG. 5c is a top plan view depicting a hole of a via and a first portion of a pad of the via covered by a shield of a pattern and a second portion of a pad covered by an aperture of the pattern.
Figure 5D:
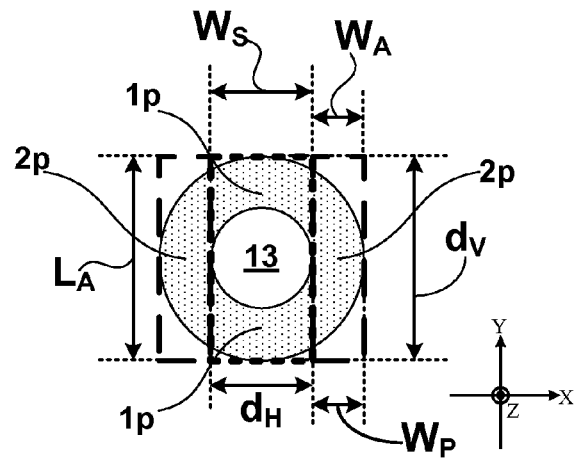
FIG. 5d is a top plan view depicting dimensional relationships between a pattern and a via.

In FIGS. 5b through 5d, the shield 33 can have a width $W_S$ that is selected so that when the stencil 50 and the substrate 21 are aligned with each other and are positioned in contact with each other, then the shield 33 will be positioned over the hole 13 and the width $W_S$ of the shield 33 will cover the hole 13 and a first portion 1p of the pad 12 as depicted in a dashed outline of the shield 33 in FIG. 5c. Similarly, the apertures 31 can have a width $W_A$ that is selected so that the apertures 31 are positioned over a second portion 2p of the pad 12 when the substrate 21 and the stencil 50 are aligned and in contact with each other as depicted by the dashed outline of the apertures 31 in FIG. 5c. In FIGS. 5c and 5d, The dashed outlines of the shield 33 and the apertures 31 depict a top view of a relative position of the pattern 30 and the via 10 when the stencil 50 and the substrate 21 are properly aligned with each other and are in contact with each other.

In FIG. 5d, the width $W_A$ of the apertures 31 can be selected so that the width $W_A$ is greater than, less than, or equal to the width $W_P$ of the pad 12. Similarly, a height $H_A$ of the apertures 31 can be selected so that the height $H_A$ it is greater than, less than, or equal to the diameter $d_V$ of the via 10. As will be described in greater detail below, the width $W_A$ and the height $H_A$ of the apertures 31 can be selected to effectuate an over pasting, a nominal pasting, or an under pasting of a lead-free solder paste on the second portion 2p of the pad 12.

The width $W_S$ of the shield 33 can be selected so that the width $W_S$ it is greater than or equal to the diameter $d_V$ of the hole 13. The width $W_S$ of the shield 33 should be selected to ensure that a lead-free solder paste that is applied to the stencil 50 does not enter into the hole 13. Preferably, the width $W_S$ is at least slightly greater than the diameter $d_V$ as an extra measure of precaution to prevent the lead-free solder paste from entering the hole 13 and to account for any alignment error between the stencil 50 and the substrate 21.

The relationship of the shield 33 and apertures 31 as provided by the stencil 50 and the via 10 may be more fully appreciated in the perspective view of FIG. 19b. Whereas FIGS. 5a, 5b, 5c, 5d, 6a, 6b, 7a, 7b, 7c and 7d illustrate two vias 10 in substrate 21, for ease of illustration a single via 10 has been provided in FIGS. 19a~19e. Moreover, in FIG. 19b, the stencil 50 is shown disposed upon the substrate 21. As indicated by the dotted lines, the apertures 31 and shield 33 are substantially aligned to via 10. More specifically, the shield 33 is aligned to over hole 13, shield 33 having a width $W_S$ selected such that shield 33 covers all of the hole 13 and a first portion 1p of the pad 12. The apertures 31 are aligned to expose second portions 2p of the pad 12. In at least one embedment, the edge 31e of the apertures 31 are aligned with the rim 13r of the hole 13, as indicated by the dotted lines.

Figure 2:
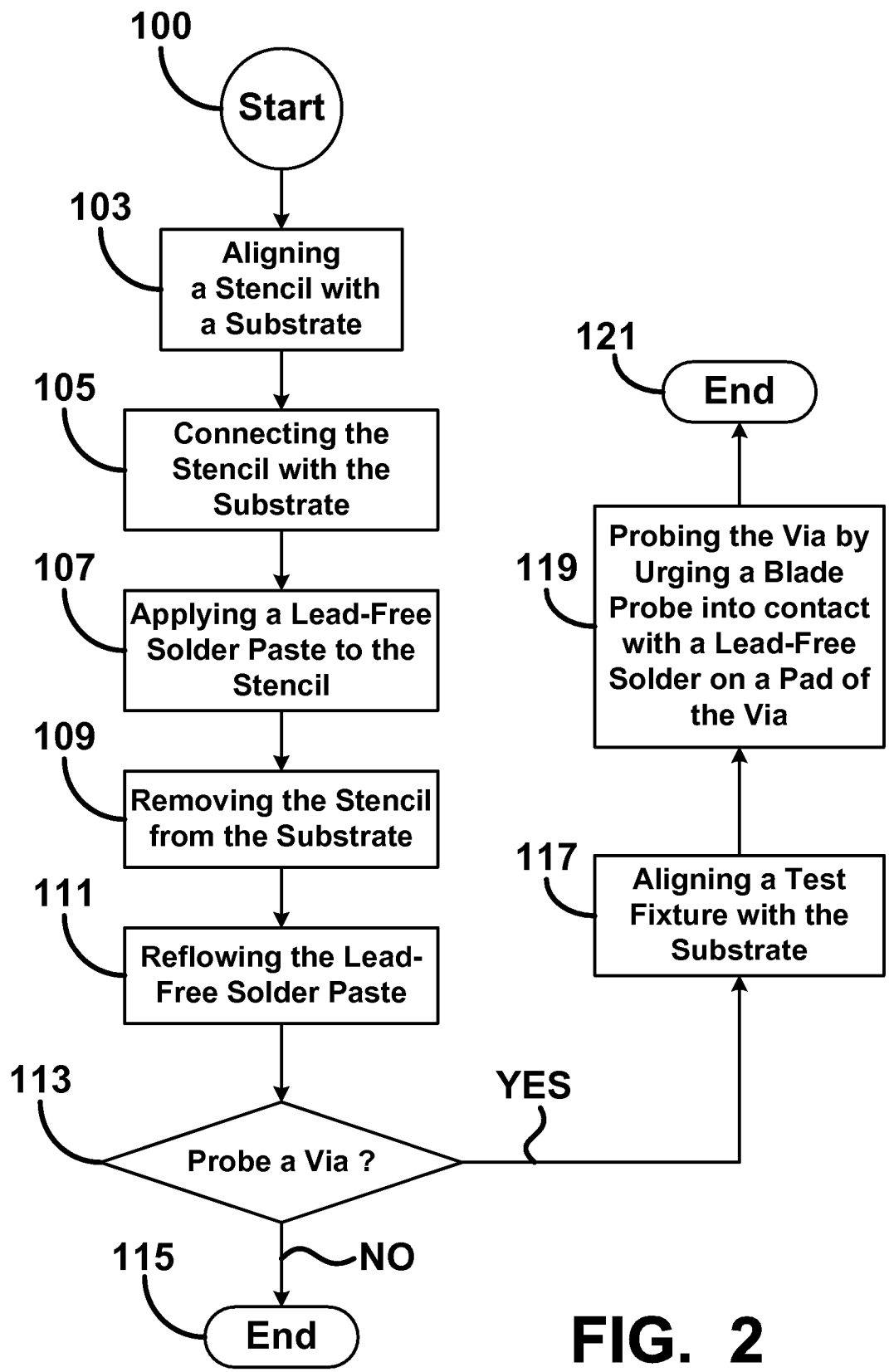
FIG. 2 is a flow diagram depicting a method of treating and optionally probing a via connected with a substrate.
Figure 6A:
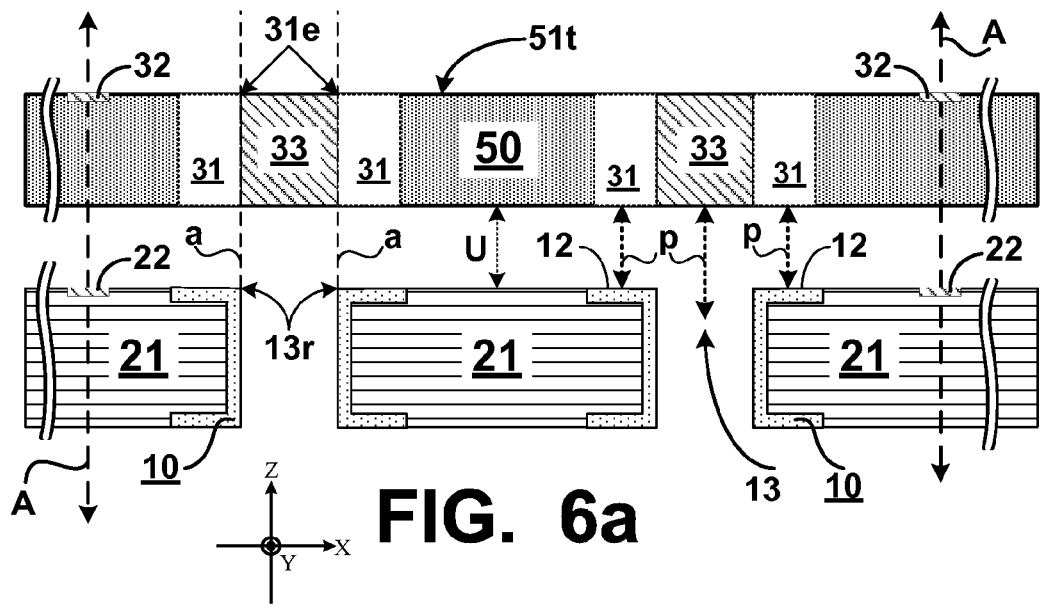
FIG. 6a is a cross-sectional view depicting a stencil aligned with a substrate.

Now, referring to FIG. 2 and FIG. 6a, at the stage 103, the stencil 50 is aligned A with the substrate 21 so that the apertures 31 and the shield 33 are positioned p in alignment with their respective pads 12 and holes 13. Moreover, the aligning at the stage 103 may also be necessary to align a the edges 31e of the apertures 31 with the rim 13r of the hole 13. The fiducial marks (22, 32) can be used to effectuate the aligning using optical, machine vision, or other means that are well understood in the electronics art to position the stencil 50 and the substrate 21 in alignment with each other. After the aligning, the stencil 50 and the substrate 21 can be urged U into contact with each other and are held in alignment to prevent relative motion between the stencil 50 and the substrate 21.

Figure 6B:
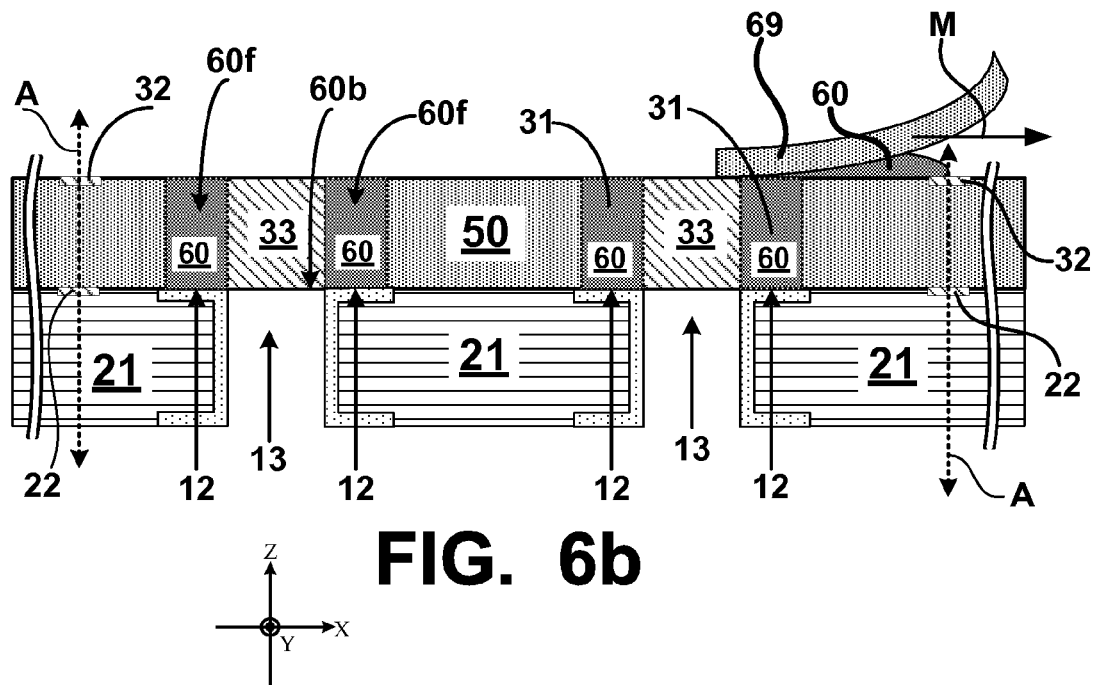
FIG. 6b is a cross-sectional view depicting a stencil aligned with and in contact with a substrate.

In FIG. 6b, at a stage 105, the stencil 50 is connected with the substrate 21 so that the shield 33 covers the hole 13 and the first portion 1p of the pad 12 and the apertures 31 are positioned over the second portion 2p of the pad 12. Preferably, the shield 33 completely covers the hole 13. Moreover, it is also preferable that the edges 31e of the apertures 31 are aligned with the rim 13r of the hole 13. The stencil 50 and the substrate 21 are held in alignment A with each other at the stage 105 to prevent misalignment of the apertures 31 and the shield 33 with the pad 12 and the hole 13 during a subsequent printing process.

At a stage 107, a lead-free solder paste 60 (paste 60 hereinafter) is applied to the stencil 50 to print the paste 60 on the second portion 2p of the pad 12 only. That is, the shield 33 prevents (i.e. blocks) the paste 60 from entering the hole 13 or from being printed on the first portion 1p of the pad 12 as depicted by the dashed arrow 60b and the paste 60 to flows through the apertures 31 and is printed on the second portion 2p of the pads 12 as depicted by the dashed arrows 60f. If the via 10 is a through hole via, then there may be pads 12 on both sides (21t, 21b) of the substrate 21 as depicted in FIG. 4b. However, the paste 60 need only be applied to the pad 12 on a side of the via 10 that the via 10 will be probed from (see 21t in FIG. 7b). The paste 60 can be printed on the pads 12 using a blade 69 that moves M across the stencil 50 to squeeze the paste 60 through the apertures 31 and onto the pads 12. A volume of the paste 60 that is deposited on the pads 12 will be application specific and can depend on several factors including but not limited to the type of paste 60 used, a viscosity of the paste 60, and a thickness $T_S$ of the stencil 50 (see FIG. 5b).

Figure 19C:
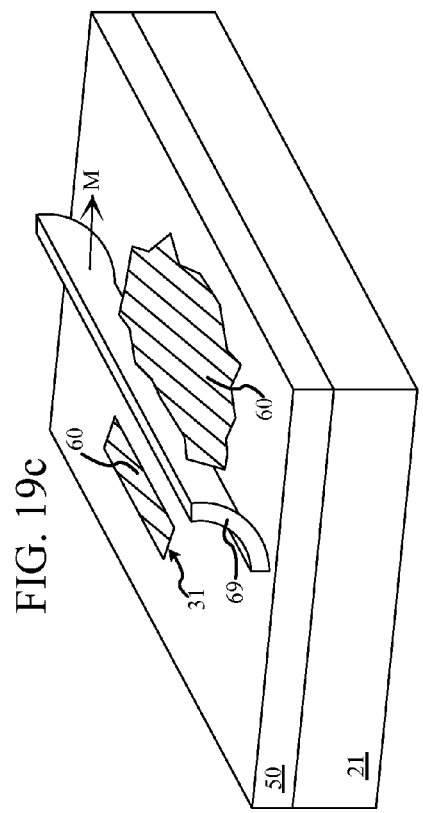

FIG. 19C provides a perspective view of the paste 60 being applied. As blade 69 is moved M across the top surface of stencil 50, paste 60 is squeezed into the apertures 31. As apertures 31 are aligned to portions 2p of the pad, and shield 33 covers hole 13, see FIGS. 19b and 5d, it is understood and appreciated that the paste 60 is being disposed upon portions of the pad 12 only and no paste 60 is disposed over hole 13.

Figure 7A:
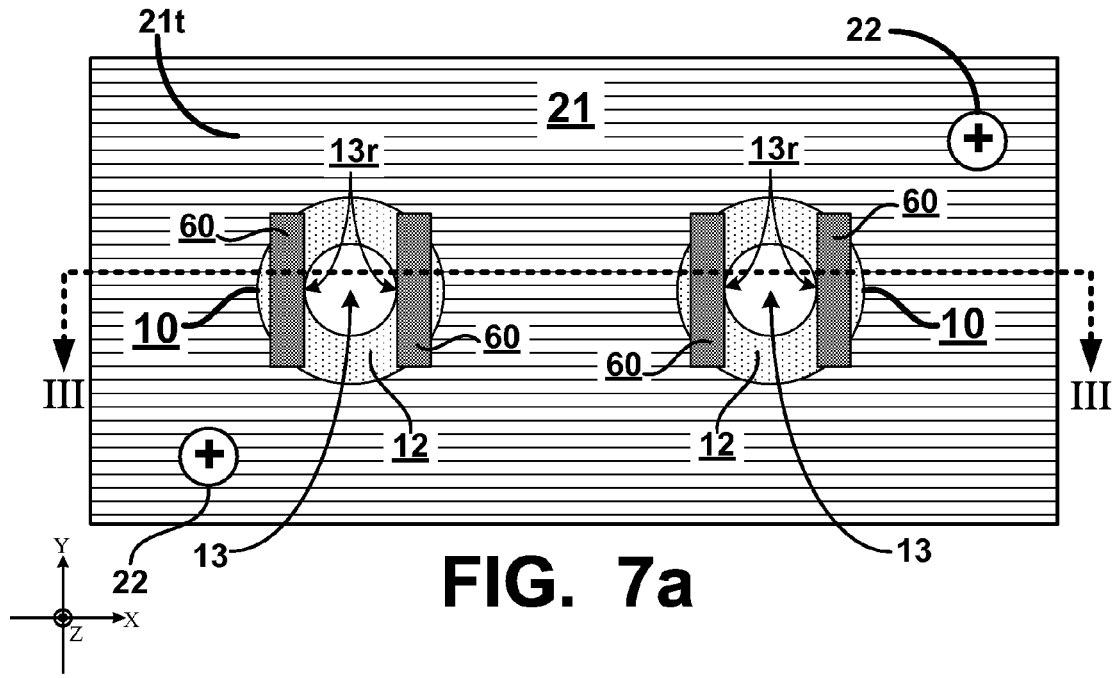
FIG. 7a is a top plan view depicting a lead-free solder paste applied to a second portion of a pad.
Figure 7B:
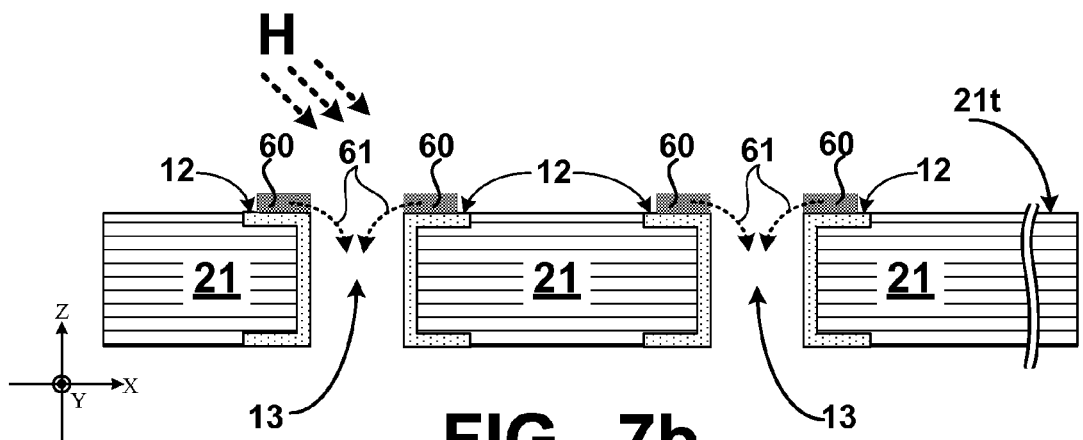
FIG. 7b is a cross-sectional view along a dashed line III-III of FIG. 7a and depicts a reflowing of a lead-free solder paste applied to a second portion of a pad.

After the printing of the paste 60 on the pads 12, at a stage 109, the stencil 50 is removed from the substrate 21. In FIGS. 7a and 7b, after the removing of the stencil 50, the paste 60 remains on the second portion 2p of the pad 12. In FIG. 7a, if the edges 31e of the apertures 31 were aligned a with the rim 13r as was described above, then a portion of the paste 60 abuts with a portion of the rim 13r of the hole 13.

Figure 18D:
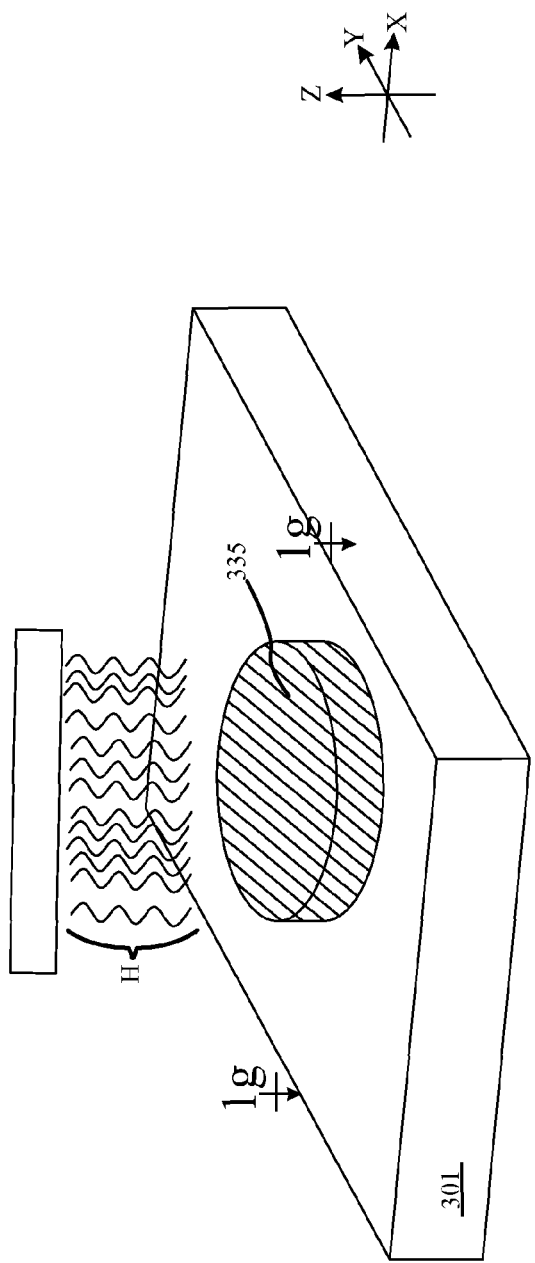
Figure 18E:
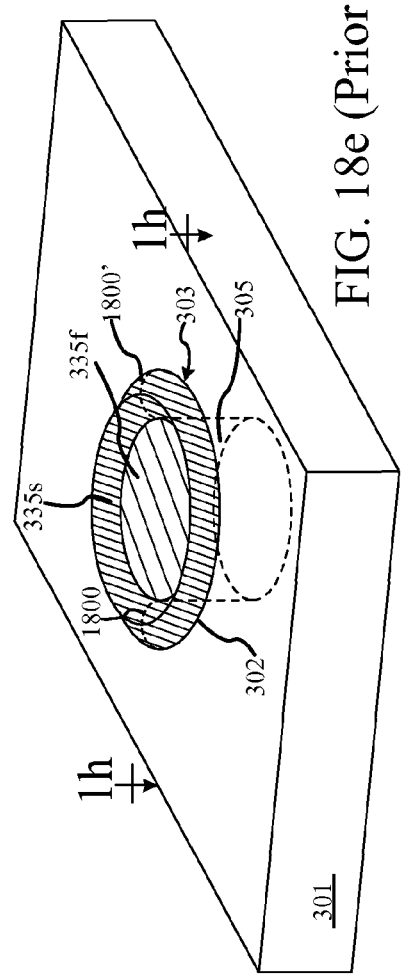
Figure 19D:
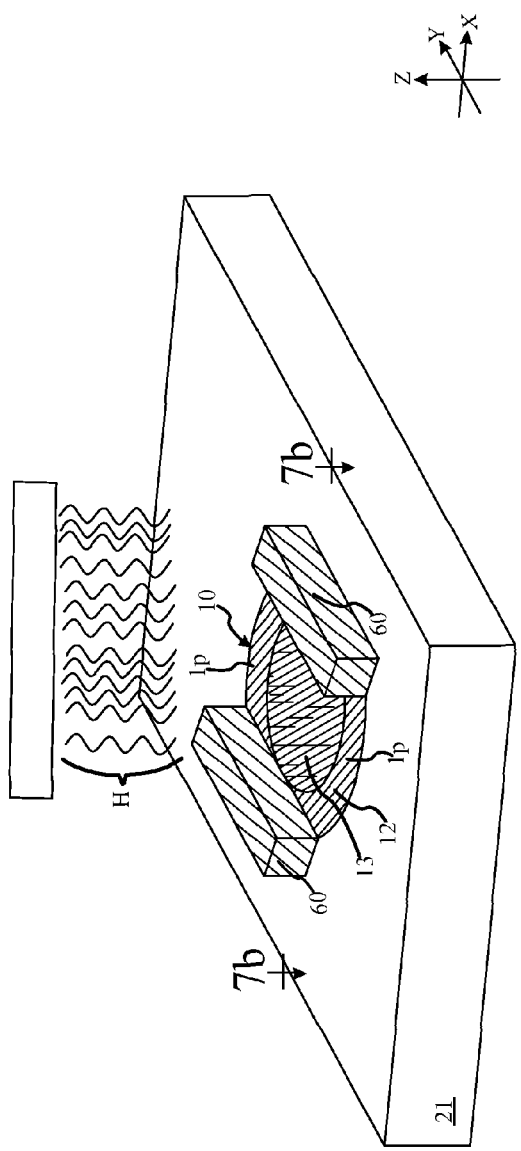
Figure 19E:
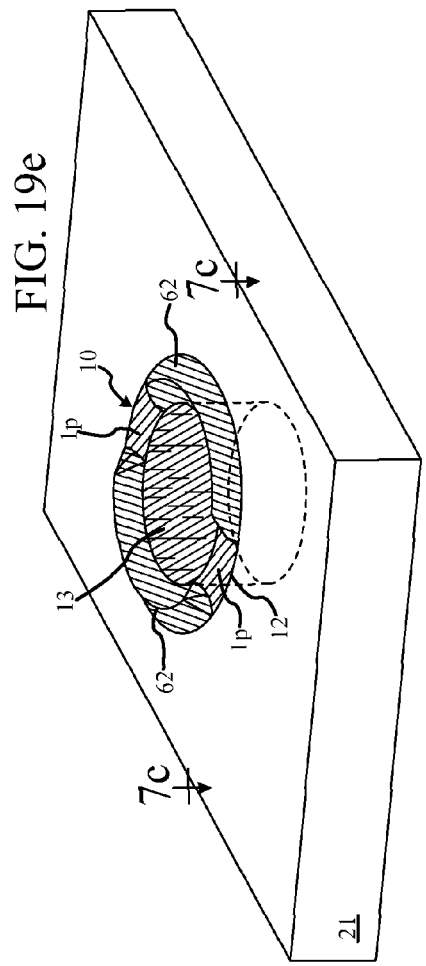

The remaining paste 60 is once again more fully appreciated in FIG. 19d. Reference indicators are provided to indicate the cut through area along the ZX-plane that most closely corresponds to one of the right via 10 in FIG. 7b. Specifically, there are two blocks of paste 60 shown disposed upon sections of pad 12 of via 10 either side of hole 13. This is in sharp contrast to the disc of paste 335 shown to cover the entire via in prior art FIG. 18d. Moreover, there is a reduced amount of paste 60 and the reduced amount of paste 60 is specifically placed as physically separate deposits adjacent to the via 10. The paste is reflowed by the application of heat H, as is more fully discussed with respect to FIG. 7b.

In FIG. 7b, at a stage 111, the paste 60 is reflowed. The process of heating a substrate, such as a PCB or a PCA, for example, to reflow a lead-free solder paste is well understood in the electronics art. Accordingly, the reflowing can be accomplished by heating H the paste 60 and/or the substrate 21. During the reflowing, a flux 61 (see dashed arrows) in the paste 60 drains through the hole 13 and a lead-free solder 62 (solder 62 hereinafter) in the paste 60 wets only a portion of a surface area of the pad 12 and remains on the pad 12. Unlike prior lead-free solder pasting processes where a pad of a via is pasted 1:1 or an entirety of the pad is over pasted (i.e. >1:1) by a lead-free solder paste, the reduced amount of the paste 60 results in a reduced amount of the solder 62 and a reduced amount of the flux 61. Therefore, during the reflowing at the stage 111, very little or none of the solder 62 that wets the pad 12 flows into the hole 13. Consequently, the hole 13 is not filled up (i.e. is not plugged up) by the solder 62. Additionally, the reduced amount of the paste 60 also reduces the amount of the flux 61 so that a volume of the flux 61 that flows into the hole 13 during the reflowing at the stage 111 is not sufficient to pool in the hole 13 or around the pad 12 possibly flooding an area that surrounds the edge 12e of the pad 12.

On the other hand, in prior lead-free solder pasting processes, the over pasting deposited too much of the paste on the pad and the resulting volume of the paste resulted in flux pooling around the edge of the pad where the flux accumulated and could potentially interfere with probing of the pad. In contrast, even if a small volume of the solder 62 flows into the hole 13 during the reflowing, that volume of solder 62 will not be sufficient to fill up the hole 13. As a result, the flux 61 that flows into the hole 13 does not have a foundation of solder 62 upon which to pool and the flux 61 does not reside at or near the rim 13r, the flux 61 does not pool around the edge 12e of the pad 12, and the hole 13 is not obstructed by the solder 62 or the flux 61 and can be probed during an in-circuit-test (ICT hereinafter). For example, during ICT, a tip of a probe can enter the hole 13 because the hole 13 is not plugged with solder 62 or flux 61.

Figure 7C:
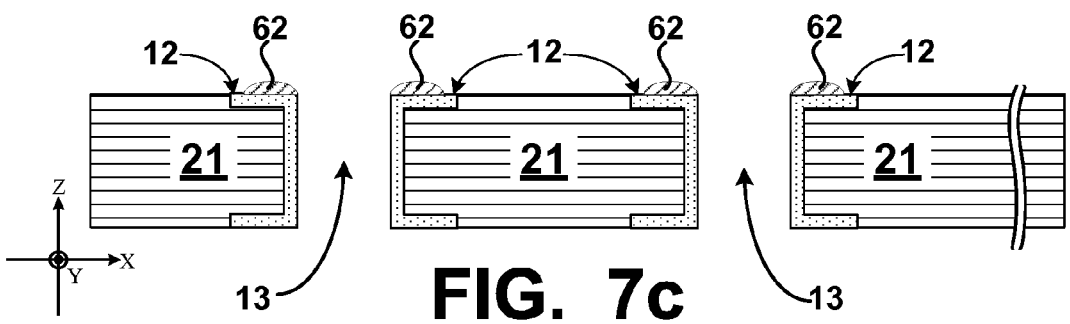
FIG. 7c is a cross-sectional view depicting a lead-free solder connected with a second portion of a pad after a reflowing process.
Figure 7D:
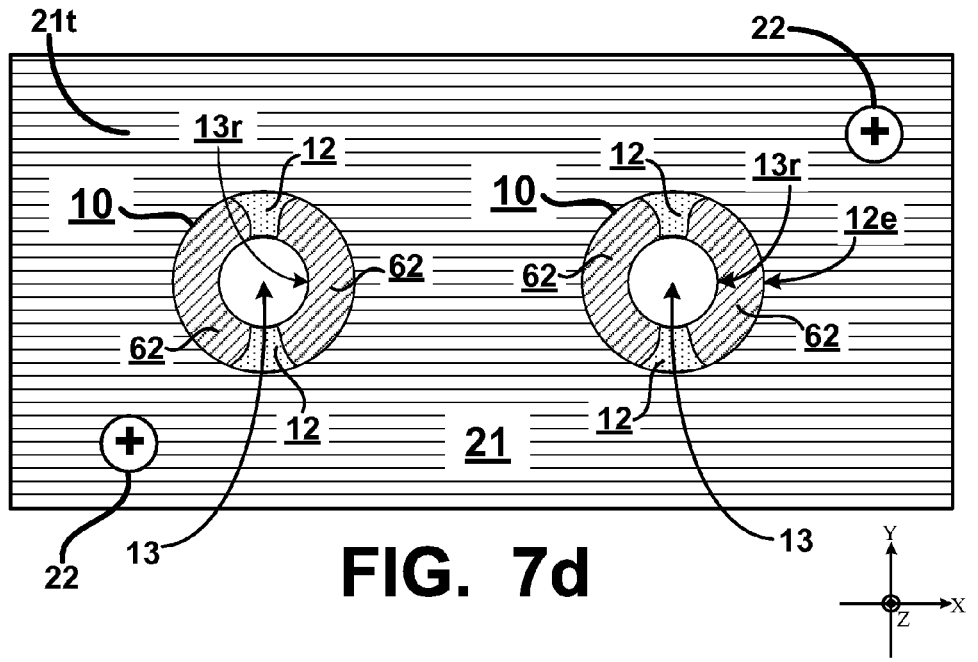
FIG. 7d is a top plan view depicting a lead-free solder connected with a second portion of a pad after a reflowing process.

In FIGS. 7c and 7d, after the reflowing at the stage 111, the solder 62 wets (i.e. covers) and adheres to the pad 12. During the reflowing, depending on how close to the rim 13r the paste 60 was applied to the pad 12, as the solder 62 wets the pad 12 some of the solder 62 may abut with and partially encircle the rim 13r as depicted in the top plan view of FIG. 7d. Moreover, a remainder of the solder 62 covers a portion of a surface area of the pad 12. That surface area can include some or all of the second portion 2p and some of the first portion 1p. The abutting and encircling of a portion of the rim 13r with the solder 62 is desirable because it positions the solder 62 as close to the hole 13 as is possible so that a probe aligned with the hole 13 can make contact with the solder 62 during probing as will be described below. Depending on an amount of the paste 60 that is printed on the pad 12, a composition of the paste 60, the pattern 30, and a position of the paste 60 on the pad 12, the solder 62 may extend all the way to the edge 12e of the pad 12 after the reflowing. Additionally, a surface coating including but not limited to an organic solderability preservative (OSP) may be applied to the pad 12. The OSP is applied to the pad 12 during the board manufacturing process.

In FIG. 7d, after the reflowing at the stage 111, the reflowed solder 62 is substantially symmetrically positioned around the hole 13 and forms two separate and substantially mirror image sections of solder 62 on the pad 12. The symmetry about the hole 13 and a shape of the solder 62 on the pad 12 can define a butterfly like pattern. The shape is called a butterfly pattern because the solder 62 is symmetrically positioned on opposite sides of the hole 13 and the separate sections of the solder 62 have an appearance like those of the wings of a butterfly. The final symmetry of the solder 62 with respect to the hole 13 is due in part to a position of the apertures 31 with respect to the shield 33. Preferably, in FIG. 5a, the apertures 31 are symmetrically positioned on opposite sides of the shield 33 so that the paste 60 is substantially symmetrically positioned on opposite sides of the hole 13 after the applying of the paste 60 at the stage 107. However, as will be described below, the pattern 30 can include more than two apertures 31 so that the paste 60 can be applied to the pad 12 in more than two sections that are positioned around the hole 13 and those sections can be substantially symmetrically positioned around the hole 13. When more than two sections of the paste 60 are printed on the pad 12, there will be more than two of the first portions 1p that are not covered by the paste 60.

Referring again to FIG. 2, after the reflowing at the stage 111, it may be desirable to probe the via 10. The probing can be part of an ICT of the substrate 21. Conversely, it may be desirable to probe the via 10 at a later time. Therefore, at a stage 113 a decision may be made to probe the via 10 after the reflowing at the stage 111 as depicted by the YES branch or at a later time as depicted by the NO branch. If the NO branch is selected, then the method 100 can terminate at a stage 115. On the other hand, if the YES branch is selected, then the method 100 can continue at a stage 117. Prior to describing the stages 117 through 119 of FIG. 2, a probe for probing the via 10 will be described below.

Figures 8A, 8B, 8C:
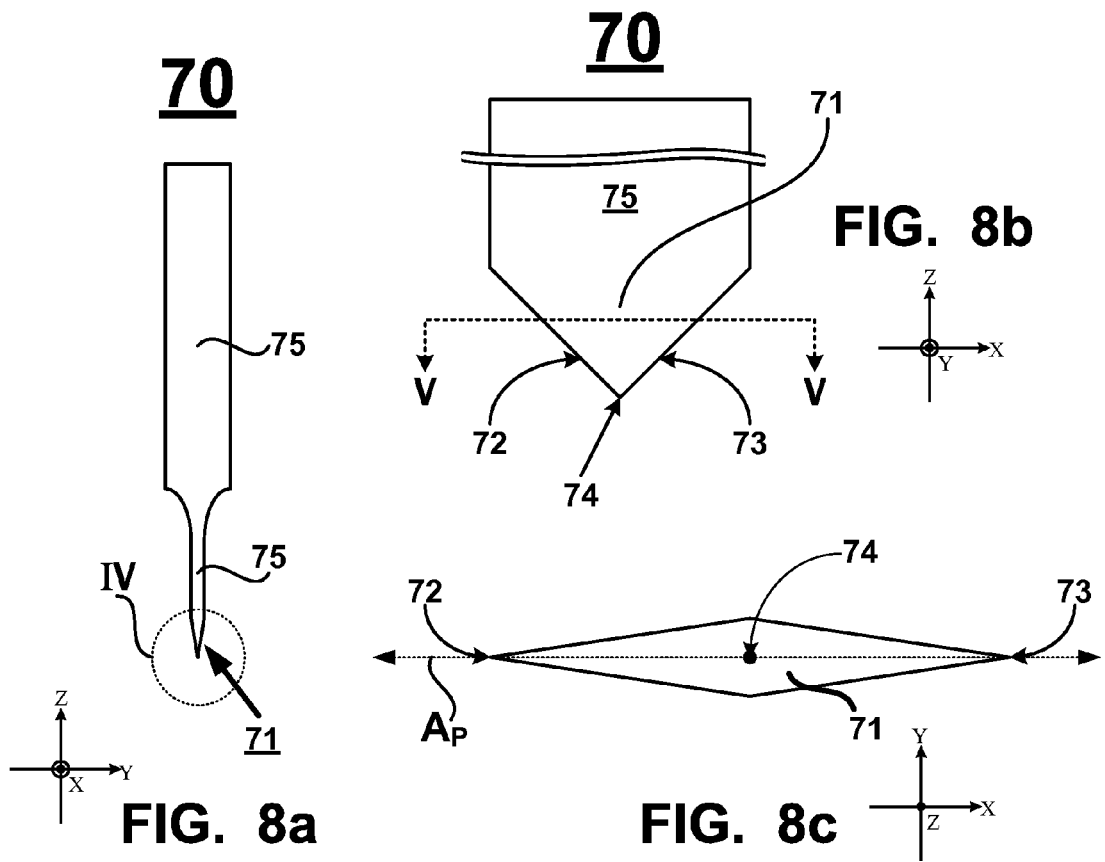
FIG. 8a depicts an end angle profile view of a blade probe.
FIG. 8b is a face view of FIG. 8a and depicts first and second edges of the blade probe.
FIG. 8c is a cross-sectional view along a dashed line V-V of FIG. 8b.

Turning to FIGS. 8a through 8c, an example of a probe for probing the via 10 with the aforementioned butterfly pattern of the solder 62 is depicted. In FIG. 8a, a blade probe 70 includes a shaft 75 and a blade 71 connected with the shaft 75. The blade 71 includes a tip 74, a first edge 72, and a second edge 73. The first and second edges (72, 73) are collinear with each other as depicted by a probe axis $A_P$ passing through the vertices of the first and second edges (72, 73) as depicted in FIG. 8c. Furthermore, the first and second edges (72, 73) converge at the tip 74 as depicted in FIG. 8b. Typically, the blade 71 is smaller in dimension than the shaft 75 because the blade 71 is sized to complement the dimensions of the via 10. Therefore, the shaft 75 may optionally taper in a direction towards the tip 74 as depicted in FIG. 8a. The blade probe 70 can be made from an electrically conductive material, such as copper (Cu), beryllium copper (BeCu), steel, stainless steel, gold (Au) plated stainless steel, aluminum (Al), or titanium (Ti), for example.

Because the lead-free solder 62 is positioned on opposite sides of the hole 13, the pad 12 is not completely covered by the solder 62 in a region where the first portion 1p was masked by the shield 33. Accordingly, after the reflowing at the stage 111, some of the first portion 1p of the pad 12 is not covered by the solder 62. In FIG. 9a, the substantially symmetrical position of the solder 62 on opposite sides of the hole 13 defines an axis $A_V$ that passes through the region of the pad 12 that is not covered by the solder 62. When the blade probe 70 probes the via 10, it is desirable for the first and second edges (72, 73) of the blade 71 to have a preferred orientation relative to the solder 62 so that a portion of the first and second edges (72, 73) makes a contact C with the solder 62 (see dashed ovals for C in FIG. 9a). The preferred orientation is an angle Δ measured between the axis $A_V$ and the probe axis $A_P$. Preferably, the probe axis $A_P$ is substantially orthogonal to the axis $A_V$ so that the angle Δ is as close to a right angle (e.g. 90 degrees) as is possible.

The wetting of the solder 62 along a portion of the rim 13r during the reflowing can result in a portion of the solder 62 abutting with the rim 13r. Particularly, when the paste 60 abuts with the rim 13r as was described above. Consequently, when the blade 71 is urged into contact with the solder 62, the contact C between the first and second edges (72, 73) and the solder 62 is made at or near the rim 13r. In FIG. 9b, the contact C is achieved even when there is a slight misalignment of the probe axis $A_P$ with the axis $A_V$ as denoted by an angle $\Delta_1$. As one example, the angle $\Delta_1$ can in a range of about ±15 degrees of the preferred orientation of 90 degrees in FIG. 9a.

In FIG. 9c, a portion of the first and second edges (72, 73) of the blade 71 are depicted in contact C with the lead-free solder 62 during a probing of the via 10. Preferably, the tip 74 is substantially aligned with an axis $A_H$ that is symmetrically centered about the hole 13 so that both the first and second edges (72, 73) contact C the lead-free solder 62. If the tip 74 is not aligned with the axis $A_H$, then only one of the edges (72, 73) may contact the lead-free solder 62. It is preferable for both of the edges (72, 73) to contact the lead-free solder 62 to minimize a contact resistance between the blade probe 70 and the via 10 and to ensure reliable and repeatable probing of the via 10 during ICT.

The blade probe 70 can shaped to be received and retained in a barrel as is well understood in the electronics art. Accordingly, in FIG. 10a, the shaft 75 can include a plunger body 75r that includes a dimension $d_R$ that is less than the dimension $d_S$ of the shaft 75. If the shaft 75 is circular in cross-section, then the dimension $d_R$ can be a reduced diameter section of the shaft 75. The shaft 75 also includes a plunger tail 75p that is connected with the plunger body 75r. The plunger tail 75p can include a portion 75f that is adapted to engage a spring as will be described below.

In FIG. 10b, a barrel 76 includes a cavity 78 adapted to receive the shaft 75 and a spring 79 positioned in the cavity 78 and in contact with the plunger tail 75p. The barrel 76 also includes a structure 74 that retains the shaft 75 in the cavity 78 with the spring 79 compressed and in contact with the plunger tail 75p. There are several means for implementing the structure 74. For example, the shaft 75 can be inserted into the cavity 78 to compress the spring 79 and the barrel 76 can be intentionally deformed (i.e. crimped) so that the structure 74 reduces a dimension dB of the barrel 76 in the region proximate the plunger body 75r so that the plunger tail 75p is in contact with and is captured by the structure 74 and the shaft 75 is retained in the barrel 76 with the spring 79 in compression and in contact with the plunger tail 75p. The portion 75f can be flat in order to provide a planar surface for the spring 79 to engage with. The dimension $d_B$ is selected so that the dimension $d_S$ of the shaft 75 will fit into the cavity 78 without binding and the shaft 75 can move up and down in the cavity 78 when the blade 71 is urged into contact with the via 10 to be probed.

In FIG. 10c, a receptacle 90 includes a cavity 92 adapted to receive the barrel 76. The receptacle 90 can include a structure 94 that retains the barrel 76 in the cavity 92. As one example, the structure 94 can be a dimple that extends into the cavity 92 and provides a friction fit between the barrel 76 and the receptacle 90 so that the barrel 76 is retained in the cavity 92 by the friction fit, but can be removed by applying a force sufficient to pull the barrel 72 out of the receptacle 90. The barrel 76 can be rotated in the receptacle 90 so that the probe axis $A_P$ has the preferred orientation with respect to the axis $A_V$ and the friction fit prevents the barrel 76 from rotating out of the preferred orientation. The receptacle 90 is adapted to be connected with a test fixture (not shown). The test fixture can be like the kind used for ICT of PCB's and PCA's. A structure 98 on the receptacle 90 can be used to retain the receptacle 90 in a bore of the test fixture that is adapted to receive the receptacle 90. For example, the structure 98 can provide a friction fit between the bore and the receptacle 90. Moreover, the friction fit can be used to position the probe axis $A_P$ in the aforementioned preferred orientation. A section 96 of the receptacle 90 can be used to facilitate a connection of a wire (not shown) to the receptacle 90. The connection of the wire to the section 96 can be accomplished by crimping, wire wrapping, or soldering, for example. The barrel 76 and the receptacle 90 can be made from the same electrically conductive materials as the blade probe 70.

FIGS. 10d through 10g, depict examples of how the preferred orientation Δ can be obtained. In FIG. 10d, the shaft 75 can include a key 75k and the barrel 76 can include a slot 76s that complements a shape of the key 75k. In FIG. 10e, when the shaft 75 is inserted i into the barrel 76 with the key 75k aligned with the slot 76s, the probe axis $A_P$ will have a fixed orientation relative to the barrel 76. Preferably, the key 75k is symmetrically positioned on the shaft 75 so that the shaft 75 moves in the barrel 76 without binding in the cavity 78 (see cross-sectional view in FIG. 10f).

Figure 11A:
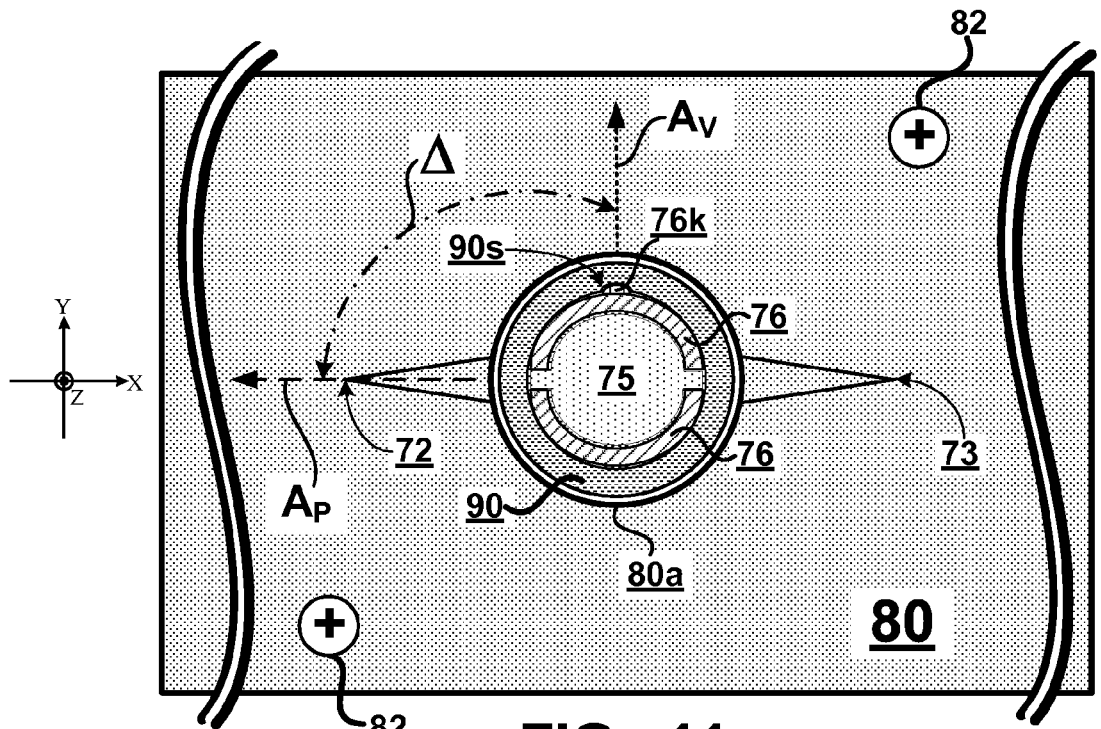
FIG. 11a is a top plan view depicting an example of a blade probe mounted to a test fixture in a preferred orientation
Figure 11B:
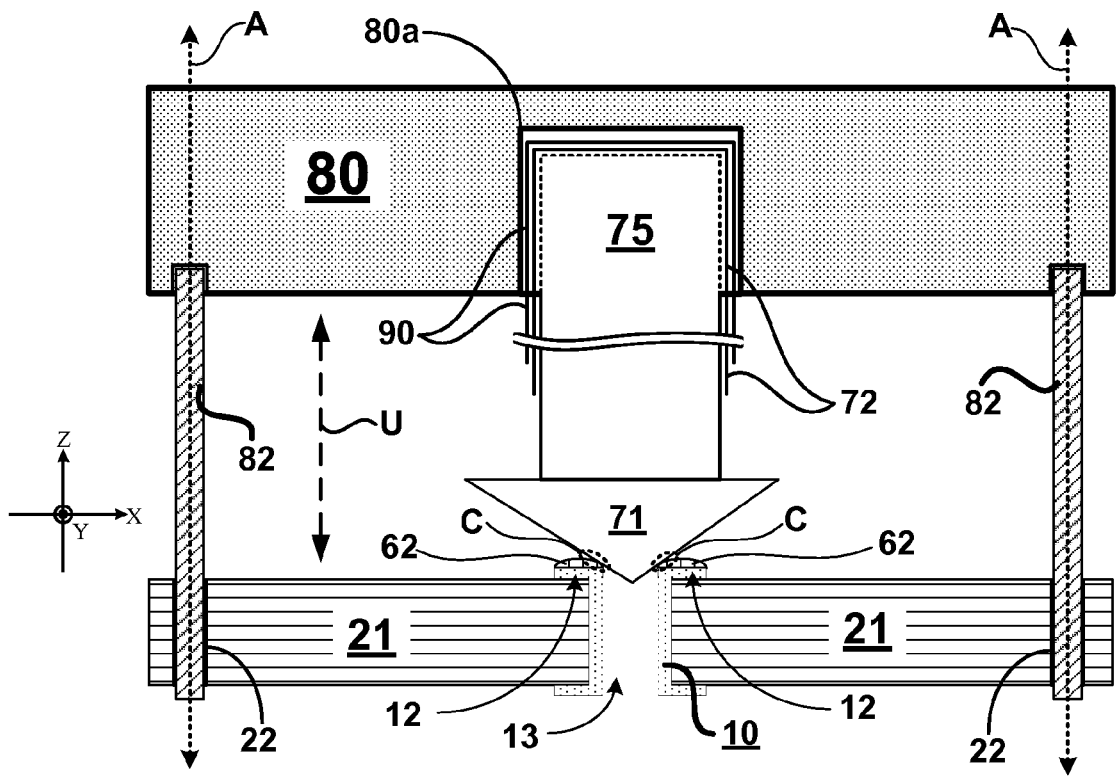
FIG. 11b is a cross-sectional view depicting a test fixture aligned with a substrate and a blade probe probing a via with a lead-free solder on a pad of the via.

Similarly, the barrel 76 can include a key 76k and the receptacle 90 can include a slot 90s that complements a shape of the key 76k. When the barrel 76 is inserted into the cavity 92 with the key 76k aligned with the slot 90s, the probe axis $A_P$ will have a fixed orientation relative to the receptacle 90 (see FIG. 10g). Moreover, in FIG. 11a, if the receptacle 90 is mounted to a test fixture 80 in a proper orientation, then the probe axis $A_P$ will have the preferred orientation Δ with respect to the axis $A_V$. For example, the receptacle 90 can be inserted into a bore 80a in the test fixture 80 with the structure 98 (see FIG. 10c) providing a friction fit between the bore 80a and the receptacle 90. The receptacle 90 can then be rotated in the bore 80a to obtain the preferred orientation Δ of the probe axis $A_P$ relative to the axis $A_V$. In FIG. 11b, a set of pins 82 on the test fixture 80 can be inserted into apertures 22 on the substrate 21 to align A the test fixture 80 with the substrate 21 in preparation for ICT and to align the blade probe 70 with the via 10 to be probed with the probe axis $A_P$ in the preferred orientation Δ.

Reference is now made to FIG. 11b, where the test fixture 80 includes the blade probe 70 connected with the test fixture 80 in the preferred orientation Δ. Referring back to FIG. 2, at a stage 117, the test fixture 80 and the substrate 21 are aligned A with each other. The test fixture 80 can include alignment pins 82 that may be used in conjunction with tooling apertures 22 on the substrate 21 to align A the test fixture 80 and the substrate 21 with each other. For example, the tooling apertures 22 can be drilled into the substrate 21 and include a diameter that complements a diameter of the alignment pins 82. The aligning A and the preferred orientation of the blade probe 70 results in the blade probe 70 being positioned to make contact C with the solder 62 on the pads 12 of the via 10.

At a stage 119, the via 10 on the substrate 21 is probed by urging U the blade probe 70 into contact with the lead-free solder 62 on the pad 12 of the via 10. The alignment between the test fixture 80 and the substrate 21 should be maintained during the probing at the stage 119 to ensure that the edges (72, 73) remain in contact with the solder 62. After the probing, the method can terminate at a stage 121.

Figure 3:
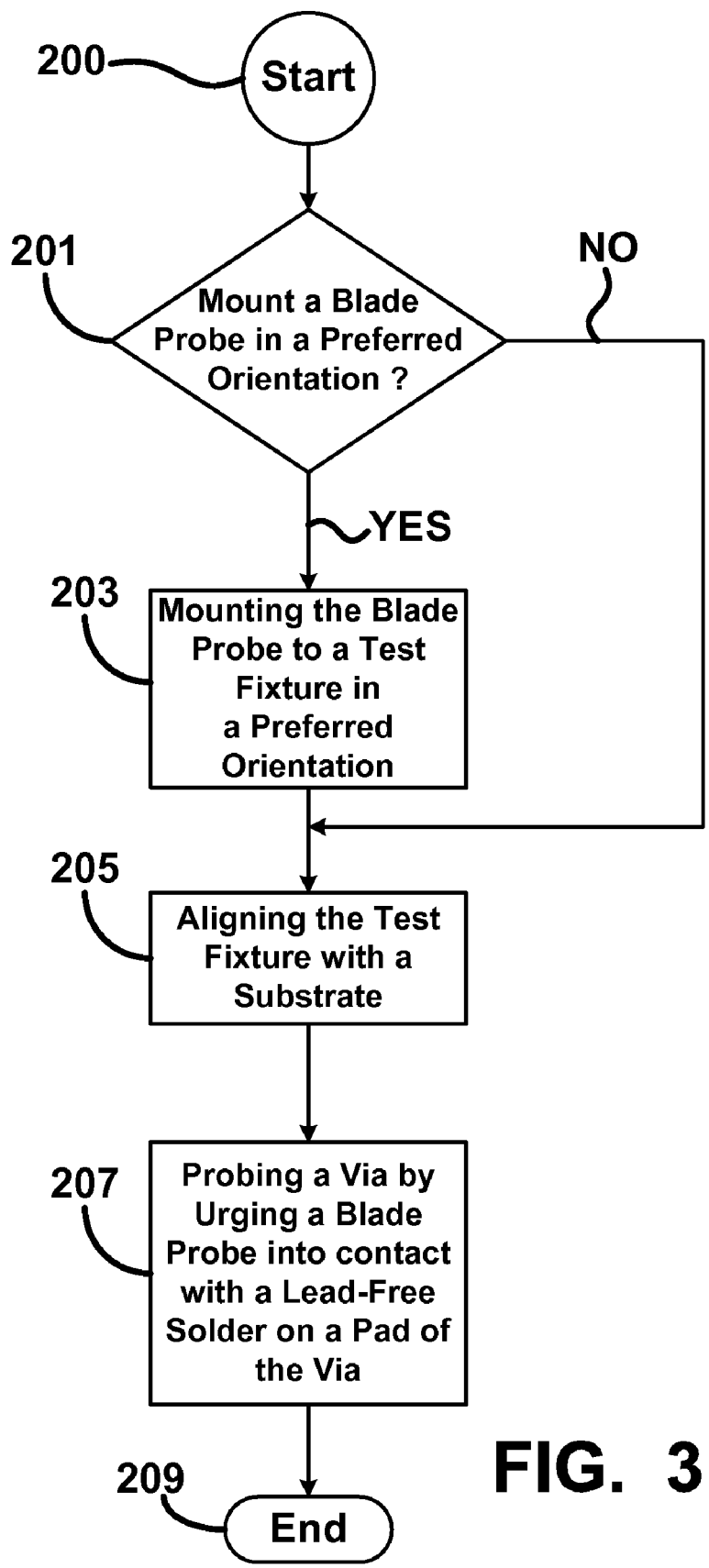
FIG. 3 is a flow diagram depicting a method of probing a via.

The probing of the vias 10 that have been treated with the solder 62 need not occur as part of the method 100. For example, after vias 10 on the substrate 21 have been treated according to the method 100, the substrate 21 can be transported to a different location and the probing can take place at a later time. To that end, FIG. 3, depicts a method 200 of probing a via 10 that has been previously treated with the solder 62 as part of a separate fabrication process (i.e. only the stages 103 through 115 of FIG. 2). It may be necessary to connect the blade probe 70 with the test fixture 80 in the preferred orientation prior to the aligning of the test fixture 80 and the substrate 21 with each other. Therefore, at a stage 201 a decision to connect the blade probe 70 with the test fixture 80 in the preferred orientation is made. If the YES branch is selected, then the blade probe 70 is connected with the test fixture 80 in the preferred orientation as was described above. If the NO branch is selected, then the blade probe 70 has already been connected with the test fixture 80 in the preferred orientation.

In either case, at a stage 205, the test fixture 80 and the substrate 21 are aligned A with each other as was described above. At a stage 207, the via 10 on the substrate 21 is probed by urging U the blade probe 70 into contact with the lead-free solder 62 on the pad 12 of the via 10. The alignment between the test fixture 80 and the substrate 21 should be maintained during the probing at the stage 207 to ensure that the edges (72, 73) remain in contact with the solder 62. After the probing, the method can terminate at a stage 209.

Turning now to FIG. 12, the stencil 50 can include patterns 30 having different shapes for the apertures 31 and the shields 33. For example, the pattern 30 on a left side of the stencil 50 includes apertures 31 and a shield 33 that have a rectangular shape; whereas, the pattern 30 on a right side of the stencil 50 includes an arcuate shape for the apertures 31 and a rectangular shape for the shield 33. The arcuate shape can be a portion of a circle having a radius of $R_C$, a portion of an ellipse, or a portion of an oval, for example.

In FIGS. 13a through 13d, four vias 10 are depicted with their respective pads 12 treated with a rectangular pattern of the paste 60 after the stage 109 but before the stage 111. In FIGS. 13a and 13c, the paste 60 is printed on the pads 12 in amount that is an over pasting of the pads 12 because the paste 60 extends outside of a boundary of the pads 12 as depicted by the dashed outline showing a portion of the pad 12 that is under the paste 60. In FIG. 13b, the paste 60 is printed on the pad 12 in an amount that is a nominal pasting because for the rectangular shape, the paste 60 extends to the boundaries of the pad 12 without exceeding those boundaries. In contrast, in FIG. 13d, the paste 60 is printed on the pad 12 in an amount that is an under pasting because the paste 60 is positioned entirely within the boundaries of the pad 12 and is inset from those boundaries. Moreover, although it may be desirable in some applications for the paste 60 to abut with the rim 13r, there may be other application where the abutting is not desirable. Accordingly, in FIG. 13d, the paste 60 is not abutted with the rim 13r.

In FIGS. 14a through 14d, the pads 12 are treated with an arcuate pattern of the paste 60. Moreover, FIGS. 14a and 14b depict an over pasting of the pads 12, FIG. 14c depicts a nominal pasting of the pad 12, and FIG. 14d depicts an under pasting of the pad 12.

In FIGS. 15a and 15b, the pads 12 are pasted with an angular shape of the paste 60 with the paste 60 forming a triangle on the pad 12 of FIG. 15a and a chevron pattern on the pad 12 of FIG. 15b. Moreover, both pads 12 are under pasted by the paste 60. A stencil 50 with a pattern 30 for forming the paste 60 on the pad 12 of FIG. 15b is depicted in FIG. 15c. Both the apertures 31 and the shield 33 have an angular shape.

In FIGS. 16a and 16b, the pads 12 are pasted with a complex shape of the paste 60. A complex shape includes but is not limited to any combination of rectangular, arcuate, linear, non-linear, and angular shapes. FIG. 16c depicts a stencil 50 with a pattern 30 for forming the paste 60 on the pad 12 of FIG. 16b. Both the apertures 31 and the shield 33 have a complex shape. FIG. 16a also depicts another example where the paste 60 is not abutted with the rim 13r.

Although the previous discussion depicted examples where two separate sections of the solder 62 are positioned around the hole 13 and in contact with the pad 12, the present invention is not limited to the two separate sections of the solder 62. In FIG. 17a, a stencil 50 includes a pattern 30 with three apertures 31 and a shield 33. In FIG. 17b, after the applying at the stage 107, the pad 12 includes paste 60 on three separate portions disposed on the pad 12 and positioned around the hole 13. In FIG. 17c, after the reflowing at the stage 111, three separate sections of solder 62 are disposed on a portion of the pad 12 and are positioned around the hole 13. The solder 62 may or may not abut with the rim 13r. In FIG. 17d, a plunger 151 (depicted as superimposed over the pad 12) can include a chisel-type plunger tip with three edges 151 (see dashed lines) that make a contact C with the solder 62 when the plunger 150 probes the via 10. Preferably, a tip 153 where the three edges 151 converge, is aligned with the axis $A_H$ of the hole 13 of the via 10.

Referring back to FIG. 7d, after the reflowing at the stage 111, the solder 62 wets the pad 12 and preferably a portion of the solder 62 is abutted with the rim 13r. Preferably, the pattern 30 on the stencil 50 is selected so that a minimal amount of the paste 60 sufficient to wet the pad 12 and to form the two separate sections of the solder 62 is printed on the pad 12. The minimal amount of the paste 60 is desirable because a volume of flux 61 that flows into the hole 13 during the reflowing is reduced and a volume of the solder 62 sufficient to wet the pad 12 is also reduced. Therefore, in regard to the aforementioned pasting patterns describe above in reference to FIGS. 13a through 16c, an order of preference for printing the minimal amount of the paste 60 on the pad 12 is the under pasting patterns followed by the nominal pasting patterns.

Although several embodiments of the present invention have been disclosed and illustrated, the invention is not limited to the specific forms or arrangements of parts so described and illustrated. The invention is only limited by the claims.

What is claimed is:

1. A method of probing a via connected with a substrate and including separate sections of a lead-free solder that is connected with a portion of a pad of the via and is positioned around a hole of the via, comprising:
    aligning a test fixture with the substrate,
    the test fixture including a blade probe connected with the test fixture in a preferred orientation, the blade probe including a shaft and a blade connected to the shaft, the blade including a tip, and a number of edges, in which the number of edges is equal to a number of separate sections of lead-free solder, and
    the preferred orientation and the aligning are operative to position the edges to make a contact with a portion of at least one separate section of the lead-free solder directly upon the pad and abutting the edge of the hole, and
    probing the via by urging the blade probe into contact with the at least one separate section of the lead-free solder.

2. The method as set forth in claim 1, in which the blade includes a first edge and a second edge, the first and second edges are collinear with each other and in which the preferred orientation of the blade probe and the aligning of the test fixture with the substrate operatively positions the first edge and second edge in a substantially orthogonal orientation with an axis of the lead-free solder on the pad.

3. The method as set forth in claim 1, further comprising prior to the aligning:
    connecting the blade probe to the test fixture in the preferred orientation.

4. The method as set forth in claim 1, wherein during the probing, the tip and a portion of the edges are positioned in the hole of the via.

5. The method as set forth in claim 1, wherein the probing comprises an in-circuit-test process.

6. The method as set forth in claim 1, wherein the contact between the edges and at least one separate section of lead-free solder occurs above the hole.

7. The method as set forth in claim 1, wherein the contact between the edges and at least one separate section of lead-free solder occurs at a location disposed apart from an approximate center of the hole.

8. A method of probing a via connected with a substrate and including separate sections of a lead-free solder that is connected with a portion of a pad of the via and is positioned around a hole of the via, comprising:

aligning a test fixture with the substrate, the test fixture including a blade probe connected with the test fixture in a preferred orientation, the blade probe including a shaft and a blade connected with the shaft, the blade including at least two edges, and the preferred orientation and the aligning are operative to position at least a portion of the edges to make a contact with a portion of at least one separate section of the lead-free solder directly upon the pad and abutting the edge of the hole, and probing the via by urging the edges of the blade probe into contact with the at least one separate section of the lead-free solder.

9. The method as set forth in claim 8, wherein the at least two edges are about perpendicular to the shaft.

10. The method as set forth in claim 8, wherein the contact between the edges and at least one separate section of lead-free solder occurs at a location disposed apart from an approximate center of the hole.

11. The method as set forth in claim 8, wherein the blade further comprises a tip, a first edge, a second edge, the first and second edges are collinear with each other.

12. The method as set forth in claim 8, wherein during the probing, a portion of the edge is disposed in the hole of the via.

13. The method as set forth in claim 8, wherein the contact between the edges and at least one separate section of lead-free solder occurs above the hole.

14. A method of probing a via connected with a substrate and including separate sections of a lead-free solder that is connected with a portion of a pad of the via and is positioned around a hole of the via, comprising:

aligning a test fixture with the substrate, the test fixture including a blade probe connected with the test fixture, the blade probe including:
  a shaft having a longitudinal axis and a plunger body;
  a blade disposed opposite from the plunger body, including at least two edges,
  a barrel adapted to receive at least a portion of the plunger body and permit movement of the shaft along the longitudinal axis;

the aligning operative to position at least a portion of the edges to make a contact with a portion of at least one separate section of the lead-free solder directly upon the pad and abutting the edge of the hole, and probing the via by urging the edges of the blade probe into contact with the at least one separate section of the lead-free solder.

15. The method as set forth in claim 14, wherein the contact between the edges and at least one separate section of lead-free solder occurs above the hole.

16. The method as set forth in claim 14, wherein the probe is structured and arranged to maintain a preferred orientation during the probing of the via.

17. The method as set forth in claim 14, wherein the blade further comprises a tip, a first edge, a second edge, the first and second edges are collinear with each other.

18. The method of claim 1, in which the edges provide an arcuate edge.

19. The method of claim 1, in which the number of edges is three.

20. The method of claim 1, in which the angle between the number of edges is equal with respect to each other.

* * * * *